United States Patent [19]
Pulyer

[11] Patent Number: 6,002,255
[45] Date of Patent: Dec. 14, 1999

[54] PLANAR OPEN MAGNET MRI SYSTEM HAVING ACTIVE TARGET FIELD SHIMMING

[75] Inventor: Yuly M. Pulyer, Revere, Mass.

[73] Assignee: Brigham & Women's Hospital, Boston, Mass.

[21] Appl. No.: 08/974,477

[22] Filed: Nov. 20, 1997

[51] Int. Cl.[6] .................................................. G01V 3/00
[52] U.S. Cl. ...................................... 324/320; 324/319
[58] Field of Search .................................. 324/320, 319, 324/318, 314, 309, 307, 300

[56] References Cited

U.S. PATENT DOCUMENTS

| | | | |
|---|---|---|---|
| 4,379,262 | 4/1983 | Young | 324/309 |
| 4,590,427 | 5/1986 | Fukushima et al. | 324/318 |
| 4,682,111 | 7/1987 | Hughes | 324/322 |
| 5,117,188 | 5/1992 | Ohkawa | 324/318 |
| 5,331,282 | 7/1994 | McDougall et al. | 324/320 |
| 5,389,879 | 2/1995 | Pulyer | 324/320 |
| 5,402,094 | 3/1995 | Enge | 335/296 |
| 5,428,292 | 6/1995 | Dorri et al. | 324/319 |
| 5,677,630 | 10/1997 | Laskaris et al. | 324/320 |

Primary Examiner—Louis Arana
Attorney, Agent, or Firm—George W. Neuner

[57] ABSTRACT

A magnet resonance imaging system is described having an open magnet structure that provides a remote region of background field homogeneity for imaging that is open and accessible. The system includes spatial encoding gradient coils and a rf coil. The open magnet structure has an planar active shimming coil array that provides a remote region of enhanced field homogeneity with open geometry for easy accessibility to a patient. Preferably, the active planar shimming coil array has one or more pair of current loops arranged and constructed in a plane separating the open magnet structure from the remote region, a first loop having current in a first direction to provide a magnetic flux (i.e., magnetization vector) away from the plane and a second loop having current in the opposite direction to provide a magnetic flux (i.e., magnetization vector) toward the plane.

8 Claims, 26 Drawing Sheets

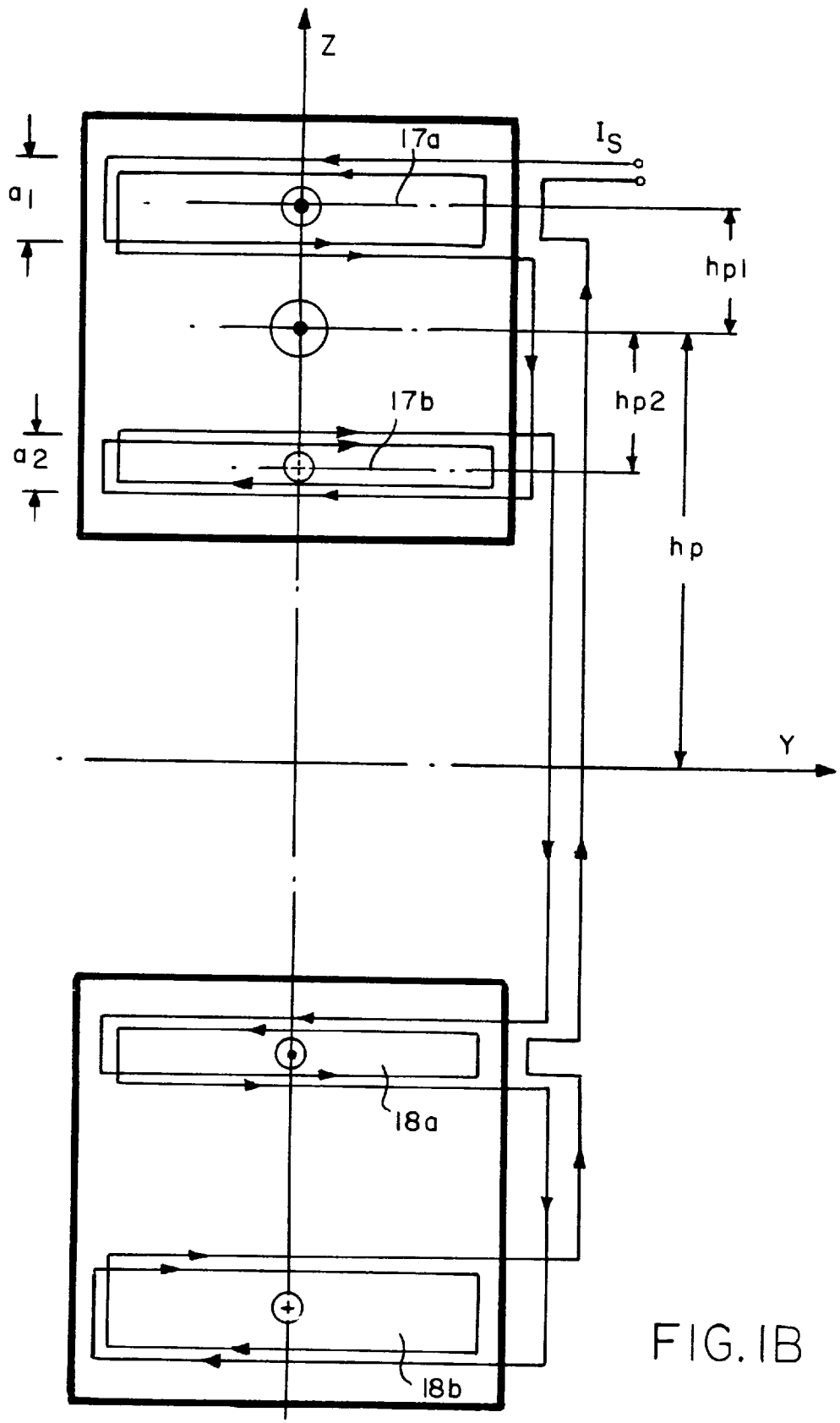
FIG. IB

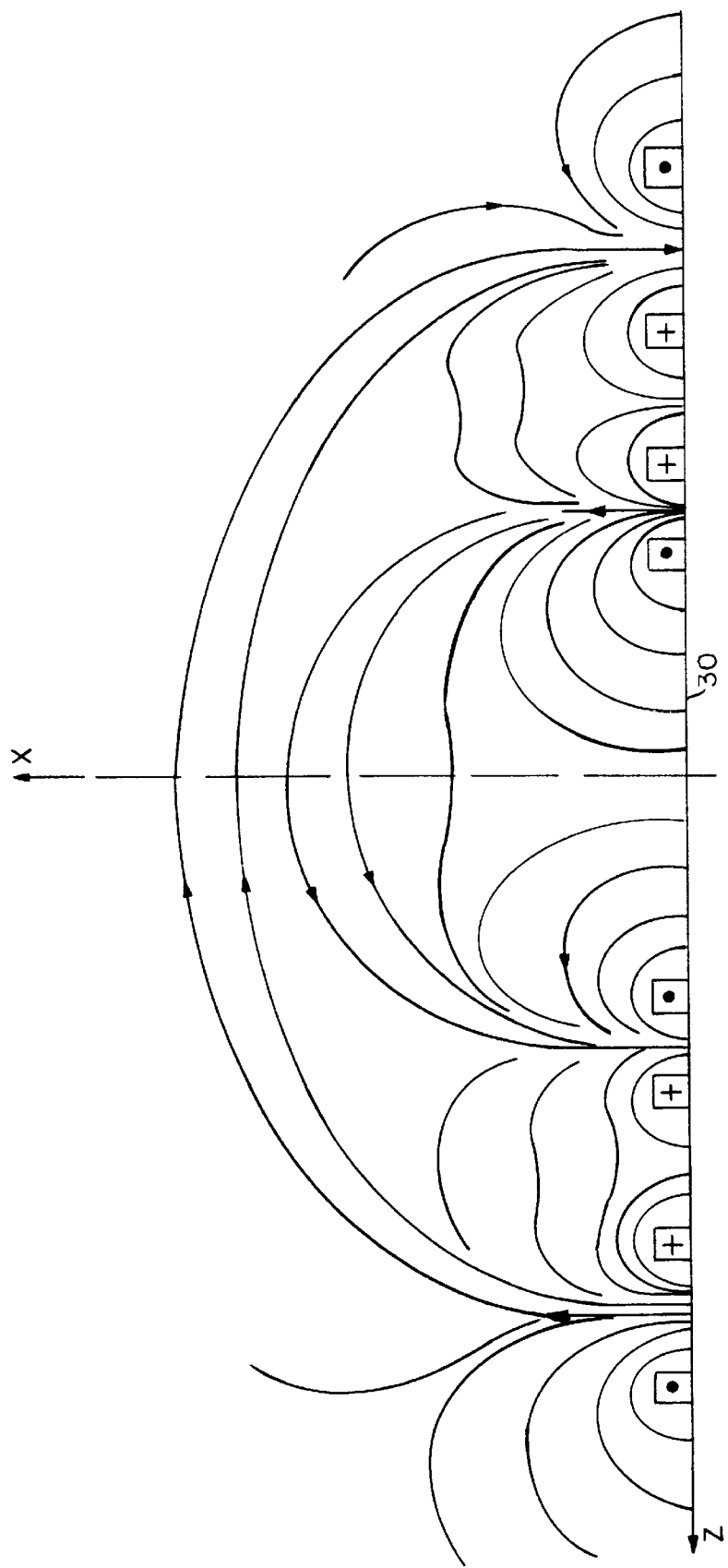

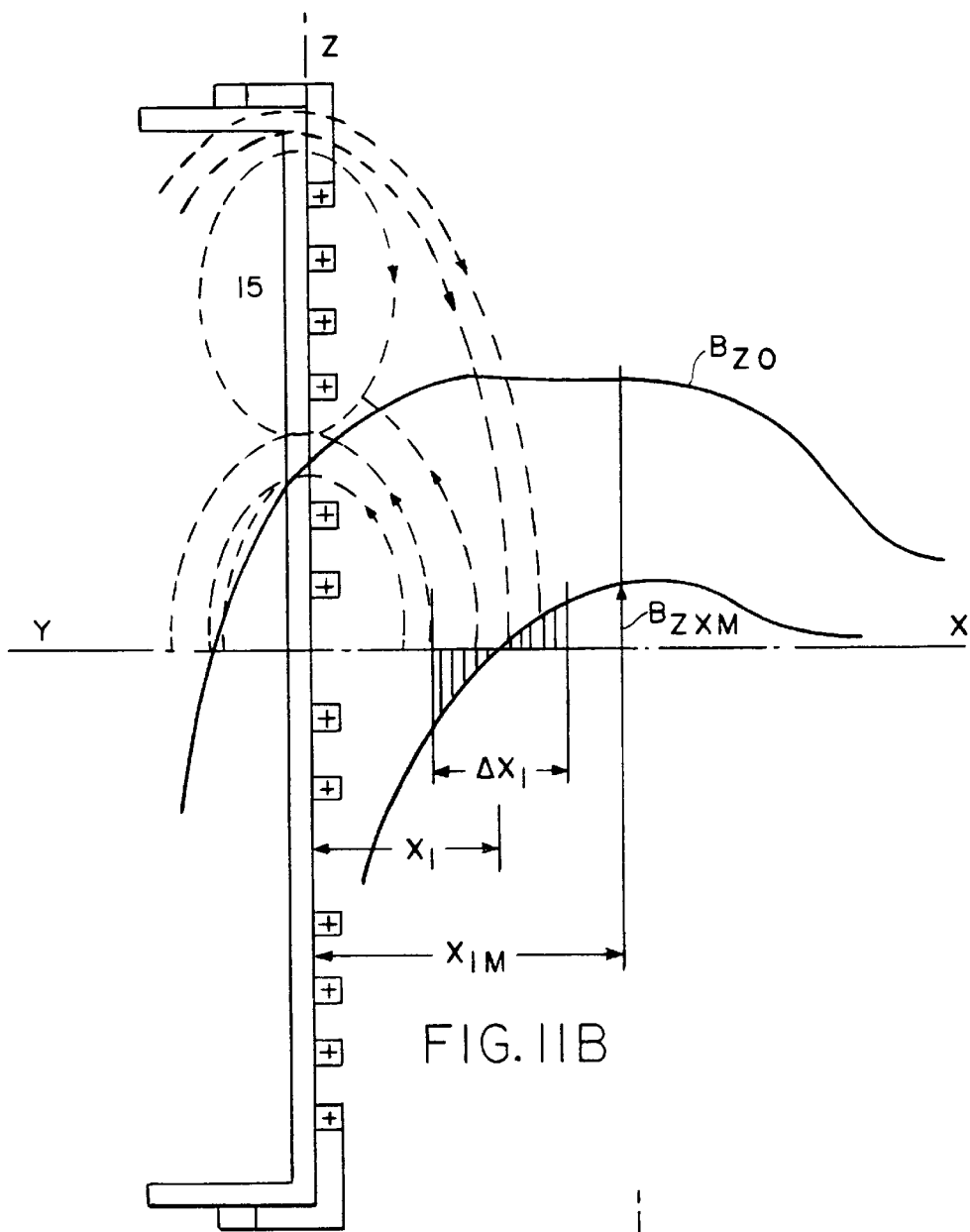
FIG. IIB
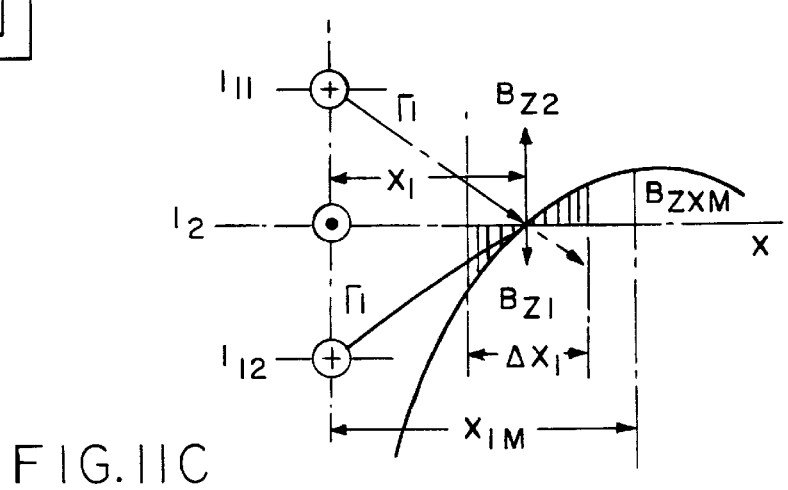
FIG. IIC

PLANAR OPEN MAGNET MRI SYSTEM HAVING ACTIVE TARGET FIELD SHIMMING

FIELD OF THE INVENTION

This invention relates magnetic resonance imaging (MRI) systems, to magnet systems for producing a homogeneous imaging field for MRI and, particularly, to open magnet systems having active target field shimming for providing a remote region of field homogeneity along with planar gradient coils for delivering gradient fields for spatial encoding in a remote target field region.

BACKGROUND OF THE INVENTION

There are known whole body MRI magnets (superconductive, resistive iron core magnets, and permanent magnets), which produce the background $B_o$ field used in MRI. The useable imaging volume in these magnets is in the region where the field homogeneity is a maximum. This volume is located in the air space centrally located between field sources. Thus, typically, MRI magnets are designed to provide a homogeneous magnetic field in an internal region within the magnet, e.g., in the air space of a large central bore of a solenoid or in the air gap between the magnetic pole plates of a C-type magnet. A patient or object to be imaged is positioned in the homogeneous field region located in such air space. In addition to the main or primary magnet that provides the background magnetic field $B_o$, the MRI system typically has gradient and rf coils, which are, used respectively for spatial encoding and exciting/detecting the nuclei for imaging. These gradient field and rf coils are typically located external to the patient inside the geometry of the $B_o$ magnet surrounding the central air space.

Prior art electromagnets such as described by Watson et al and Müller et al. and other prior art iron core magnets typically have a structural design to provide a maximum magnetic field strength at a large central air space. In addition, those types of the prior art magnets, of the iron core electro- or permanent type, have a substantial edge fringe field effect, which makes it difficult to image beginning immediately at the magnet edge or even proximal to the edge of the magnet due to lack of sufficient field homogeneity.

In U.S. Pat. No. 5,049,848 a magnet configuration for MRI mammography is disclosed. The magnetic structure 50 has a rectangular shaped magnet with at least two parallel magnetic source 5,6 connected by a ferromagnetic core flux path defining an air gap for imaging. A remote shimming C-shaped magnetic source is preferably used for shimming to decrease the front edge fringe effect of the magnetic structure 50 to create a relatively homogeneous field in the air gap beginning at the front edge for effective imaging.

Solenoidal MRI magnets (superconductive, resistive) as well as iron core C and E shape electromagnets or permanent magnets are known for imaging of the whole body and its extremities. However, such whole body MRI magnets are not generally well-suited for treatment of the patient with other modalities or for minimally invasive surgical procedures guided by real time MRI because of the limited access of the surgeon to the patient. This limited access results from the field producing means surrounding the imaging volume. Electromagnets of the C or E type iron core configuration have been designed to offer a partially open access to the patient, however, the access is still very limited with typical air gaps of only 40 cm between the pole pieces of a C type magnet. U.S. Pat. No. 5,378,988 describes a MRI system, which can provide access for a surgeon or other medical personnel, using a plurality of C-shape solenoidal magnets oriented to form an imaging volume in a central region of the magnets.

Another type of magnet specifically designed for interventional surgical guidance is General Electric's Magnetic Resonance Therapy device, which consists of two superconducting coils in a Helmholtz coil type arrangement. The air gap for this magnet is 58 cm, which typically permits access by one surgeon. None of those prior art magnets or MRI systems is ideal with regard to simultaneously offering real time imaging and fully open access to the patient. Many surgical procedures require three or more surgeons together with an array of supporting equipment and, thus, a fully open magnet configuration for a MRI system for interventional procedures is desirable. In addition, such open magnet configuration is desirable for patients that have claustrophobia.

Applications other than MRI have used magnets that produce a useful field region outside the magnet geometry. U.S. Pat. No. 4,350,955 describes means for producing a cylindrically symmetric annular volume of a homogeneous magnetic field remote from the source of the field. Two equal field sources are arranged axially so that the axial components of the fields from the two sources are opposed, producing a region near and in the plane perpendicular to the axis and midway between the sources where the radial component of the field goes through a maximum. A region of relative homogeneity of the radial component of the background field $B_r$ may be found near the maximum. The large radial field is generally denoted as the $B_o$ background field in MRI applications. See also, *J. Mag. Resonance* 1980, 41:400–5; *J. Mag. Resonance* 1980, 41:406–10; *J. Mag. Resonance* 1980, 41:411–21. Thus, two coils producing magnetic dipole fields having opposing direction are positioned axially in a spaced relationship to produce a relatively homogeneous toroidal magnet field region in a plane between the magnets and perpendicular to the axis of cylindrical symmetry. This technology has been used to provide spectroscopic information for oil well logging but has not been used for imaging.

U.S. Pat. No. 5,572,132 describes a magnetic resonance imaging (MRI) probe having an external background magnetic field $B_o$. The probe has a primary magnet having a longitudinal axis and an external surface extending in the axial direction and a rf coil surrounding and proximal to the surface. The magnet provides a longitudinal axially directed field component $B_z$ having an external region of substantial homogeneity proximal to the surface. Comparing this magnet geometry to that of U.S. Pat. No. 4,350,955, it has a background $B_o$ field with a cylindrically symmetrical region of homogeneity. However, this magnet described in the copending application provides such a field in the axial or z direction (i.e., longitudinal axis direction) whereas the other provides a background $B_o$ field in the radial or r direction (i.e., radial direction). Preferably, the $B_o$ field is provided by two magnets spaced axially and in axial alignment in the same orientation and wherein said region of homogeneity intersects a plane that is located between the magnets and that is perpendicular to the axis. For MR imaging, surrounding the primary magnet are r-, z- and φ- gradient coils to provide spatial encoding fields.

It is desirable to have new and better devices and techniques for biomedical MRI applications such as open magnet MRI systems for imaging while performing surgery or other treatments on patients or for imaging patients that have claustrophobia. It is also desirable to have portable devices and imaging techniques that could be applied to a wide variety of imaging uses.

Copending U.S. Ser. No. 08/695,174 filed on Aug. 8, 1996 describes a planar MRI system having an open magnet configuration comprising two pairs of planar pole pieces that produces a magnetic field having a substantial remote region of homogeneity.

Copending U.S. Ser. No. 08/869,009 filed Jun. 4, 1997 describes an open solenoidal magnet configuration comprises a pair of primary solenoidal coils and, located within the primary coil geometry, a bias coil system, the coils emitting an additive flux in the imaging region to generate a resulting field which provides a remote region of substantial field homogeneity.

SUMMARY OF THE INVENTION

The present invention provides an open, planar MRI system having an open magnet configuration including a planar active shimming coil array that produces a magnetic field having a substantial remote region of homogeneity. The MRI system also includes spatial encoding gradient coils and a rf coil, each preferably having a planar configuration.

The magnet configuration comprises a primary magnet system having spaced primary field emission surfaces and, located between the spaced field emission surfaces, a bias magnet system having spaced bias field emission surfaces that emit an additive flux in the imaging region to generate a resulting field which provides a remote region of substantial field homogeneity. The spaced primary field emission surfaces typically are the pole pieces of a primary magnet or a planar surface at the poles ("flux emitting ends") of a solenoidal magnet facing the target region. The spaced primary field emission surfaces each have a planar shimming array comprising two or more quasi-rectangular current loops, a first loop having current in a first direction and a second loop having a current in a direction opposing the first direction. Typically, the current loops at the primary field emission surfaces are symmetrical about an axis centered between the two surfaces. In certain embodiments of the invention, planar shimming coil arrays also are provided at the bias field emission surfaces.

In one embodiment of the present invention, the active planar shimming coil array comprises a pair of current loops arranged and constructed in a plane separating the open magnet structure from the remote region, a first loop having current in a first direction to provide a magnetic flux (i.e., magnetization vector) away from the plane and a second loop having current in the opposite direction to provide a magnetic flux (i.e., magnetization vector) toward the plane.

In another embodiment of the present invention, the magnet structure has two poles providing the primary background field and the active planar shimming coil array comprises two pairs of current loops, each pair of current loops being arranged and constructed in a plane at one pole of the magnet structure separating the open magnet structure from the remote region and comprising a first loop having current in a first direction to provide a magnetic flux away from the plane and a second loop having current in the opposite direction to provide a magnetic flux toward the plane, and wherein the arrangement of both pairs of current loops are identical.

In a further embodiment of the present invention, the magnet structure has two poles providing the primary background field and the active planar shimming coil array provides X-axis enhancement of remote field homogeneity, said shimming coil array comprising two pairs of current loops, each pair of current loops being arranged and constructed in a plane at one pole of the magnet structure separating the open magnet structure from the remote region and comprising a first substantially rectangular loop having current in a first direction to provide a magnetic flux away from the plane and a substantially rectangular second loop having current in the opposite direction to provide a magnetic flux toward the plane, the loops being arranged to have a longest side perpendicular to a longitudinal axis of the magnet structure, and wherein the arrangement of both pairs of current loops are identical.

By the term "substantially rectangular loop", as used herein, it is meant to include a rectangular loop and a loop in which the geometry has been optimized to deviate from rectangularity. Such deviation of geometry of the loop from rectangular for purposes of optimization is considered to be substantially rectangular for the purposes of the inventions described herein.

In yet another embodiment of the present invention, the magnet structure has two poles providing the primary background field and the active planar shimming coil array provides Y-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged on one side of a longitudinal axis of the magnetic structure with a first loop having current in a first direction to provide a magnetic flux away from the plane and a substantially rectangular second loop having current in the opposite direction to provide a magnetic flux toward the plane, and a second pair of loops arranged on the opposite side of the longitudinal axis, the second pair of loops having an identical arrangement with the first pair of loops, the remaining two pairs being arranged in a plane at the other pole of the magnet structure separating the open magnet structure from the remote region and having an identical arrangement with the first two pairs of loops.

In a further embodiment of the present invention, the magnet structure has two poles providing the primary background field and the active planar shimming coil array provides Z-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged inside the second pair of substantially rectangular loops, each pair of lops having a first loop having current in a first direction to provide a magnetic flux away from the plane and a substantially rectangular second loop having current in the opposite direction to provide a magnetic flux toward the plane, the second pair of loops being arranged to have opposite polarity to the first pair of loops, the remaining two pairs being arranged in a plane at the other pole of the magnet structure separating the open magnet structure from the remote region and having an identical arrangement with the first two pairs of loops, each of the loops being arranged to have a longest side perpendicular to a longitudinal axis of the magnet structure.

In a preferred embodiment of the invention, the active planar shimming coil array provides X-axis, Y-axis and Z-axis enhancement of remote field homogeneity.

Typically, the magnet geometry will be located on one side of a planar surface and the patient or body component to be imaged will be located on the opposite side of the planar surface, thereby providing a planar open magnet configuration. As described herein, the background field has a direction substantially parallel to the z-axis in a rectangular coordinate system, the y-axis and z-axis define the orientation of the planar surface, and the x-axis is perpendicular to the planar surface. The z-axis may sometimes be called the longitudinal axis.

As used herein, the term "remote" means that the field region is located external to the magnet geometry producing the field. As used herein, the terms "substantial homogeneity", "substantial field homogeneity" or "substantial relative field homogeneity" refer to and mean a region having field homogeneity sufficient for producing MRI images.

The distance of the region of homogeneity from the planar surface (i.e., the pole pieces of the primary magnets or the outward facing poles of the primary solenoidal magnets) can be controlled by varying the ratio between the magnetomotive forces of the primary magnet system and the bias magnet system as well as the dimensions of the pole pieces. The primary magnet system is the major source for background field and determines the basic field strength. The bias magnet system provides a biasing field, which contributes to the background field profile to provide the remote region of substantial homogeneity. The size, geometry, spacing and orientation angle of the coils with respect to the planar surface can influence the size of the homogeneous region. The planar shimming coil array provides improved field homogeneity.

Preferably, the side of the magnet system opposite the imaging target region is shunted by a planar ferromagnetic core back plate, which accommodates return flux and enhances magnet efficiency. The cross sectional area of the back plate can be made to have any predetermined value to keep the ferromagnetic material at saturation point.

The MRI system also preferably has (i) a planar xyz gradient coil system that produces gradient fields for spatial encoding in the region of homogeneity, i.e., the imaging volume or target region, as well as (ii) rf excitation and receiving coil (either integral or separate rf coils). Passive ferromagnetic shimming components also can be provided to increase the remote field homogeneity in a particular region.

The size of the magnet configuration and MRI system in accord with the present invention can be varied to provide whole body imaging or portable systems for localized imaging.

BRIEF DESCRIPTION OF THE DRAWINGS

FIG. 1B is plan view of the shimming coil array of FIG. 1A.

FIG. 2B is cross sectional side view along 2B—2B of the shimming coil array of FIG. 2A.

FIG. 11B is a cross sectional view of the x-gradient coil of FIG. 11A along the z-axis illustrating field lines and further schematically illustrating the $B_z$ field as a function of x at y=z=0 showing an approximately constant gradient field with respect to x.

FIG. 11C illustrates a simple three current wire array and a simple computation vector diagram for this current wire array.

DETAILED DESCRIPTION OF THE INVENTION

Figure 1A:
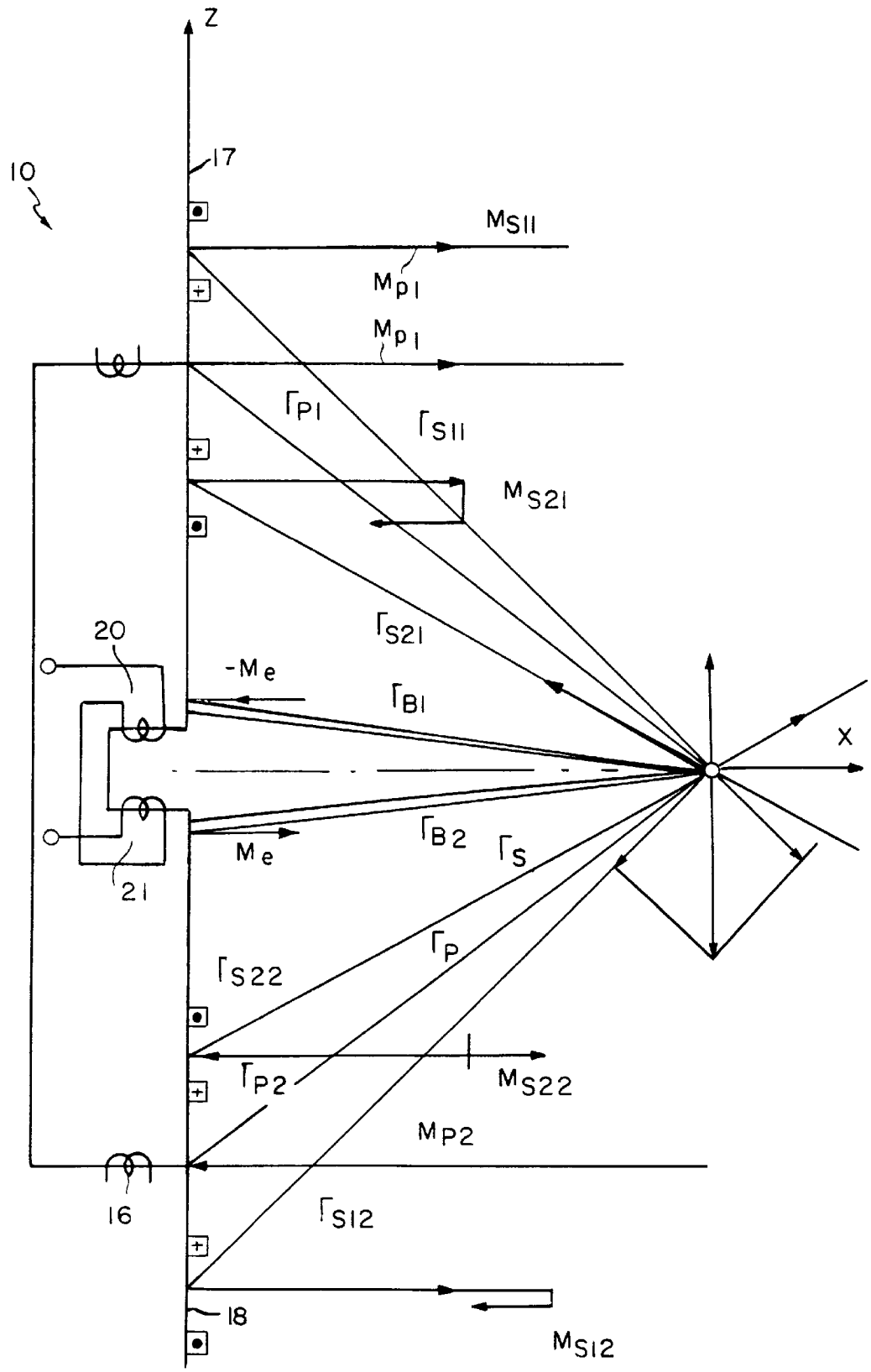
FIG. 1A is a side view schematic illustration of one embodiment of a X-axis shimming coil array in accord with the present invention to provide field to offset background field decay along the X-axis to provide additional field homogeneity in the Z,X plane.

The invention will be described with reference to the drawings wherein like reference numerals in different figures refer to the same component. In accord with the present invention, a magnet configuration for a MRI system is an open device that provides a background $B_o$ field having a remote region of substantial homogeneity and oriented substantially parallel to the plane of the magnet pole surfaces or the solenoidal coil poles (i.e., substantially perpendicular to the longitudinal center axis of the primary magnet pole surfaces or the primary solenoid coils).

In accord with the present invention, a planar shimming coil array is provided to improve or enhance target field homogeneity. Although the primary and bias magnet configuration provides substantially uniform field homogeneity in a target region, there still remains some tail off of the field with the distance from a particular plane. The planar shimming coil arrays of the present invention provide increased homogeneity in the target region, particularly in the portions of the region that suffer from tail off of field homogeneity.

As illustrated in FIG. 1A, one embodiment of a magnet system 10 in accord with the present invention has two primary coils 15,16 which provide a background $B_o$ field in a direction substantially perpendicular to the longitudinal center axis of the primary coils and having an open, easily accessible configuration. The primary coils are oriented with their longitudinal center axis substantially parallel to the x axis of the system as illustrated and provide the main background $B_o$ field as determined by the coils having turns $N_{p1}$, $N_{p2}$. Bias coils 20, 21 provide a bias field, opposing or co-directional with the main background field, as determined by the coil turns $N_{b1}$, $N_{b2}$.

Figure 1C:
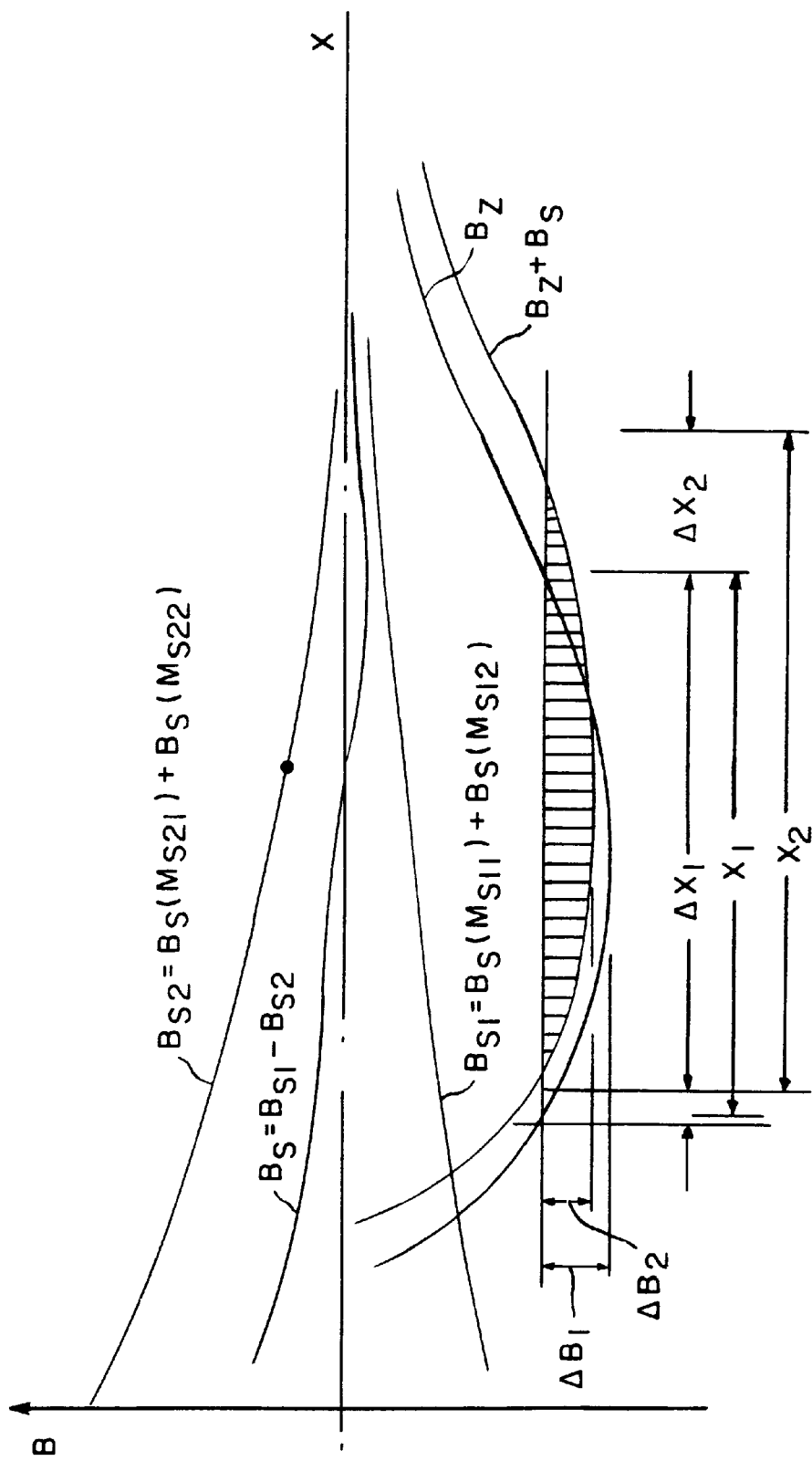
FIG. 1C is a graphical illustration of the shimming coil field provided by the shimming coil array of FIG. 1A and the contribution to the background field homogeneity along the X-axis.

A planar shimming coil array is located in the plane of each of the pole pieces 17,18 (of coils 15,16, respectively). A plan view of the pole pieces illustrating the shimming coil array is illustrated in FIG. 1B. The shimming coil array in this embodiment has two coils on each of the pole pieces. On pole piece 17, shimming coil 17a is configured to provide a magnetic flux out of the loop and shimming coil 17b is configured to provide a magnetic flux into the loop. On pole piece 18, shimming coil 18a is configured to provide a magnetic flux out of the loop and shimming coil 18b is configured to provide a magnetic flux into the loop. The current wires for the loops are illustrated in cross section in FIG. 1A. This configuration provides a remote field maximum in a given target region as illustrated by curve $B_s$ in FIG. 1C. This field maximum for the planar shimming coil array increases the range of X having a homogeneity within a predetermined $\Delta B$. Thus, this planar shimming coil array configuration provides enhanced X-axis homogeneity. The geometry of the loops, i.e., the distance between the parallel wires of each loop, as well as the number of wire turns in each loop are used to control the position of the field maximum for the shimming coil array. Preferably, loops 17a and 18b have the same geometry and number of turns, and loops 17b and 18a have the same geometry and number of turns.

Figure 2A:
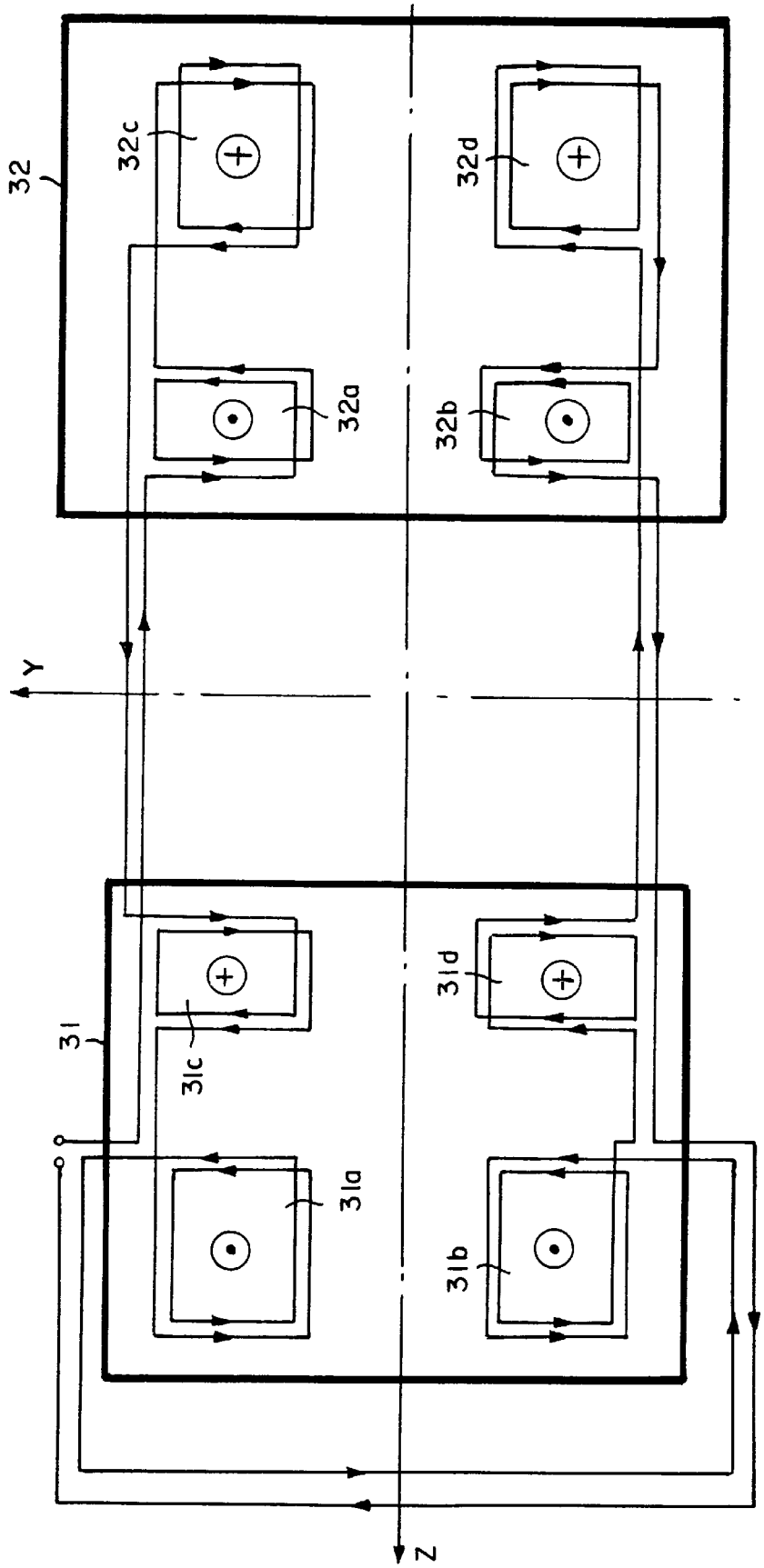
FIG. 2A is a plan view schematic illustration of one embodiment of a Y-axis shimming coil array in accord with the present invention to provide field to offset background field decay along the Y-axis to provide additional field homogeneity in the Y,Z plane.
Figure 2C:
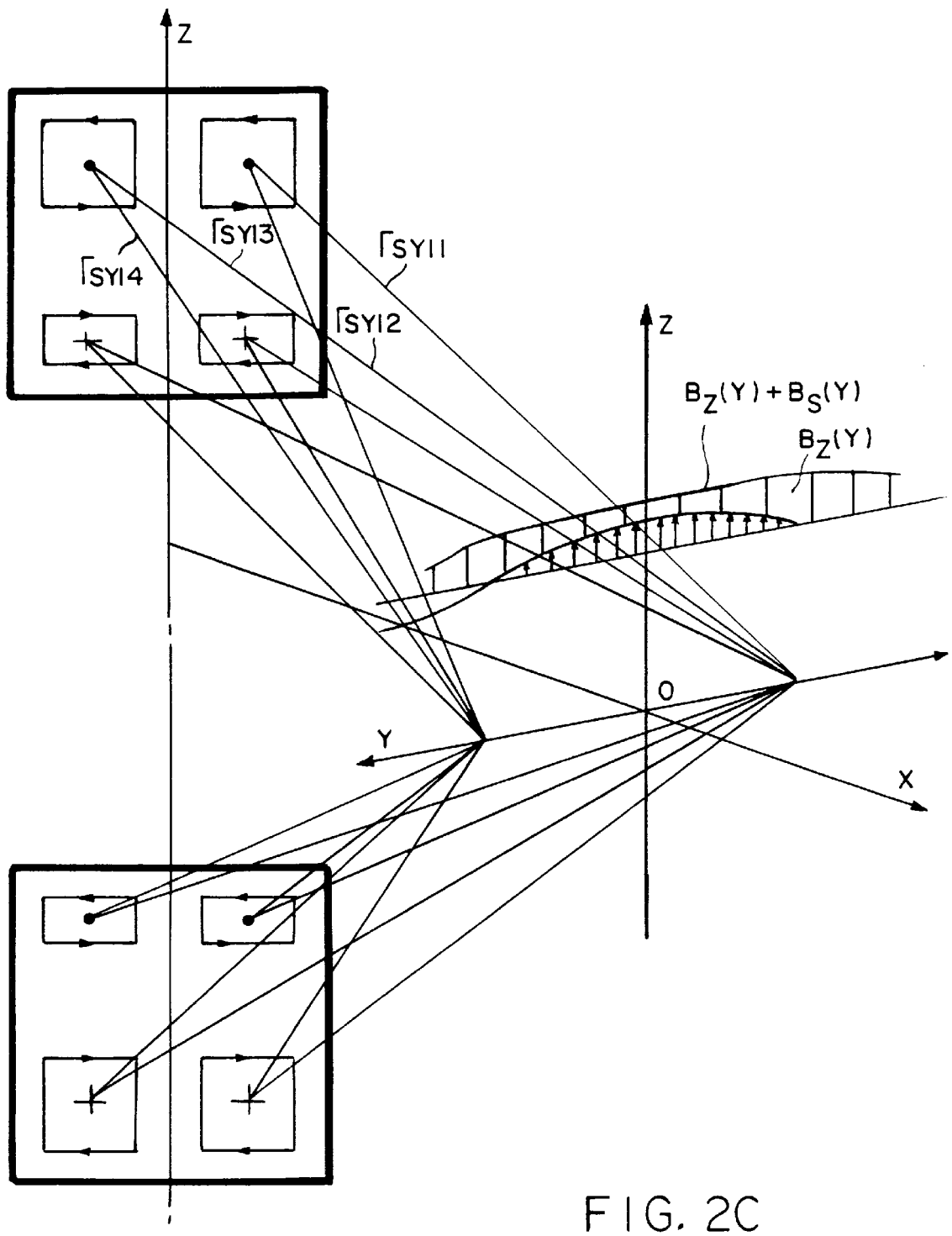
FIG. 2C is a graphical illustration of the shimming coil field provided by the shimming coil array of FIG. 2A and the contribution to the background field homogeneity along the Y-axis.

FIG. 2A provides a schematic of a planar shimming coil array configured to provides a remote field maximum in a given target region to increase the range of Y having a homogeneity within a predetermined $\Delta B$. Thus, this planar shimming coil array configuration provides enhanced Y-axis homogeneity. Along the Y-axis, enhancement of the field homogeneity is desired at both sides of the planar surface (30 in FIG. 2B), which corresponds to a table surface on which a patient is positioned. Therefore, in this embodiment, four loops are used near the corners of each pole piece. Pole piece 31 has loops 31a, 31b, 31c and 31d located near the corners of the pole piece, emitting flux as illustrated in FIG. 2A. Pole piece 32 has loops 32a, 32b, 32c and 32d located near the corners of the pole piece, emitting flux as illustrated in FIG. 2A. The corresponding wires and current direction are illustrated in FIG. 2B. FIG. 2C illustrates the remote field maximum provided by this shimming coil array along the X and Y-axes. The contribution along the X-axis is located in X,Y planes near the sides of the patient table surface. The loops of the entire array are conveniently wired in series to stabilize current. The geometry of the loops, i.e., the distance between the parallel wires of each loop, as well as the number of wire turns in each loop are used to control the position of the field maximum for the shimming coil array. Preferably, loops 31a, 31b, 32c and 32d have the same geometry and number of turns, and loops 31c, 31d, 32a and 32b have the same geometry and number of turns.

Figure 3A:
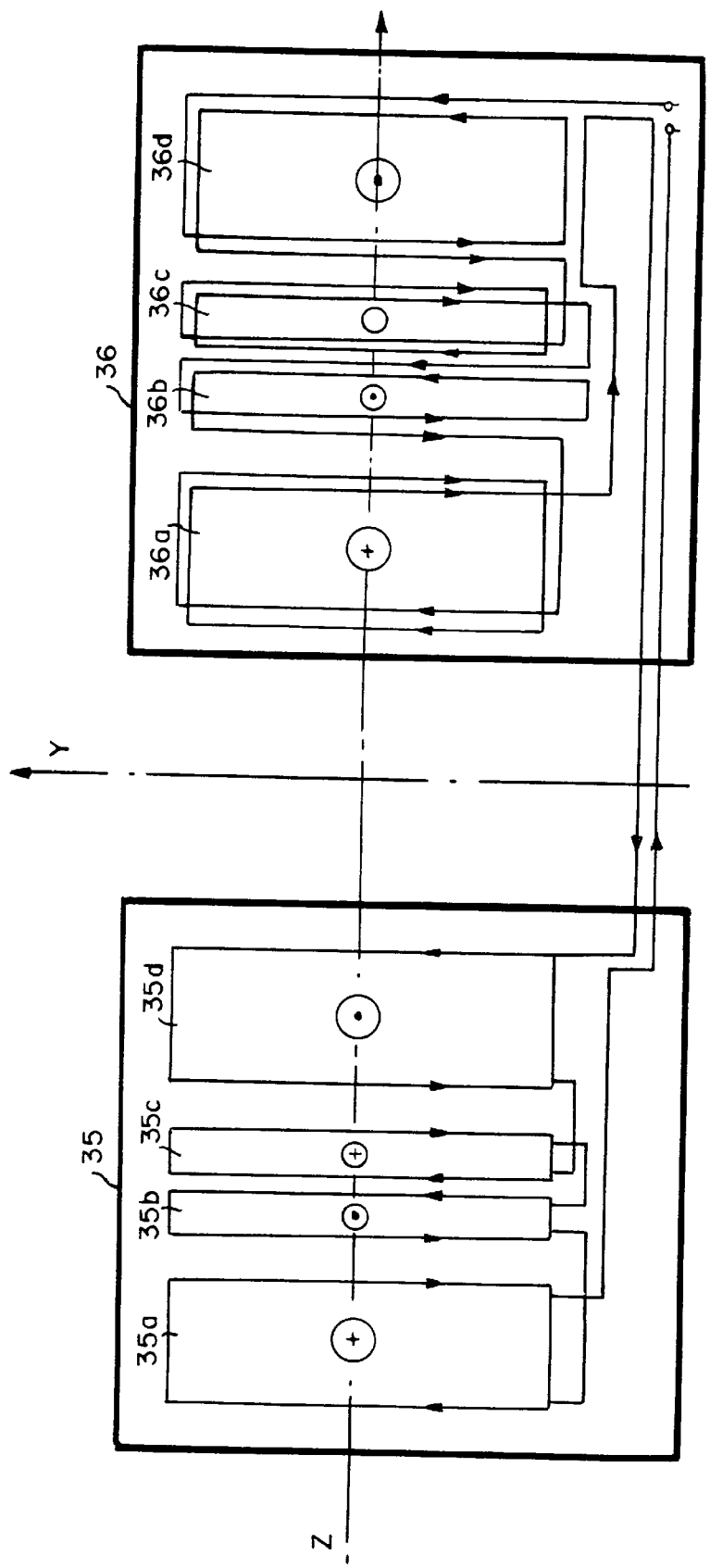
FIG. 3A is a plan view schematic illustration of one embodiment of a Z-axis shimming coil array in accord with the present invention to provide field to offset background field decay along the Z-axis to provide additional field homogeneity in the X,Z plane.
Figure 3B:
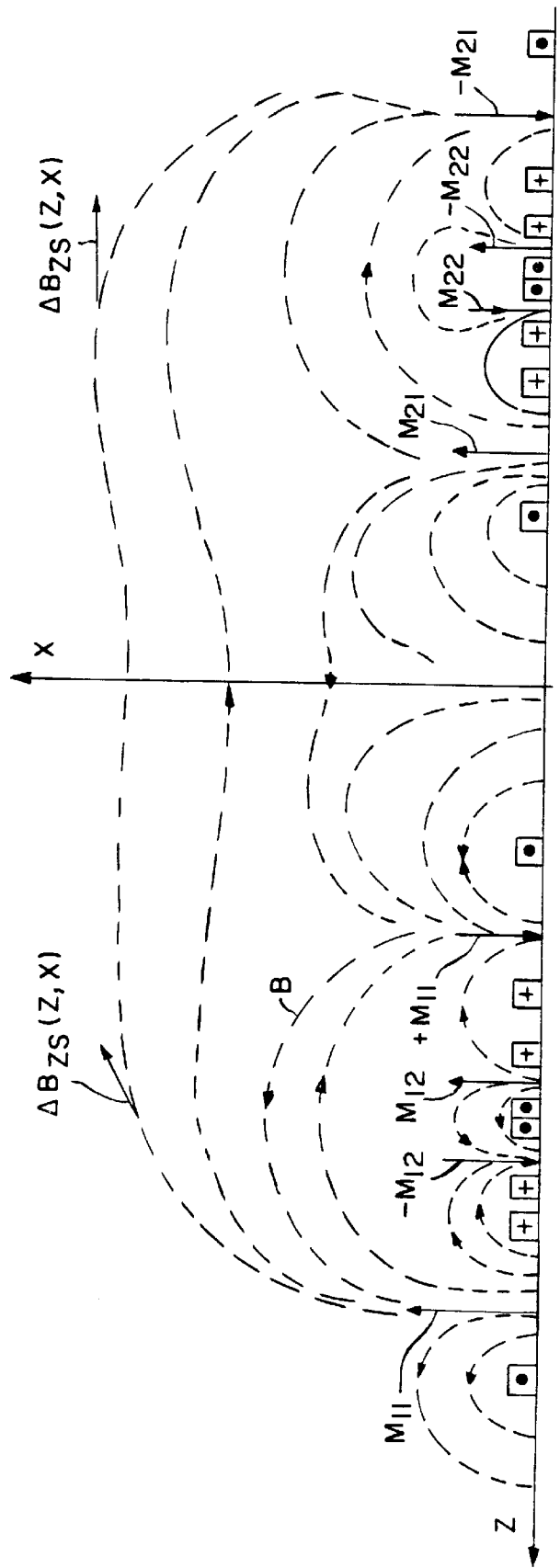
FIG. 3B is cross sectional side view along 3B—3B of the shimming coil array of FIG. 3A.
Figure 3C:
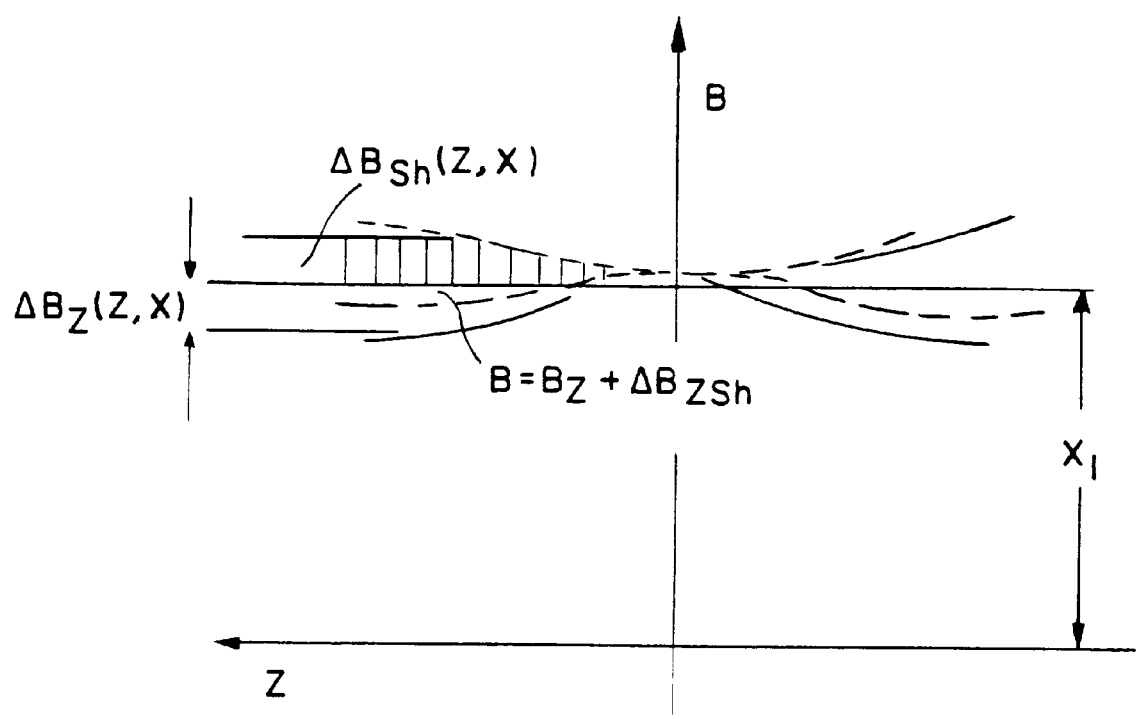
FIG. 3C is a graphical illustration of the shimming coil field provided by the shimming coil array of FIG. 3A and the contribution to the background field homogeneity along the Z-axis.

FIG. 3A provides a schematic of a planar shimming coil array configured to provides a remote field maximum in a given target region to increase the range of Z having a homogeneity within a predetermined $\Delta B$. Thus, this planar shimming coil array configuration provides enhanced Z-axis homogeneity. This is accomplished in this embodiment using four rectangular loops on each pole piece, two central loops being configured to provide a bias field to the field provided by the outer loops. Pole piece 35 has loops 35a, 35b, 35c and 35d, emitting flux as illustrated in FIG. 3A. Pole piece 36 has loops 36a, 36b, 36c and 36d, emitting flux as illustrated in FIG. 3A. The corresponding wires and current direction are illustrated in FIG. 3B, along with flux lines. FIG. 3C illustrates the two remote field maximums provided by this shimming coil array along the Z-axis. The loops of the entire array are conveniently wired in series to stabilize current. The geometry of the loops, i.e., the distance between the parallel wires of each loop, as well as the number of wire turns in each loop are used to control the position of the field maximum for the shimming coil array. Preferably, loops 35a, 35d, 36a and 36d have the same geometry and number of turns, and loops 35b, 35c, 36b and 36c have the same geometry and number of turns.

Figure 4A:
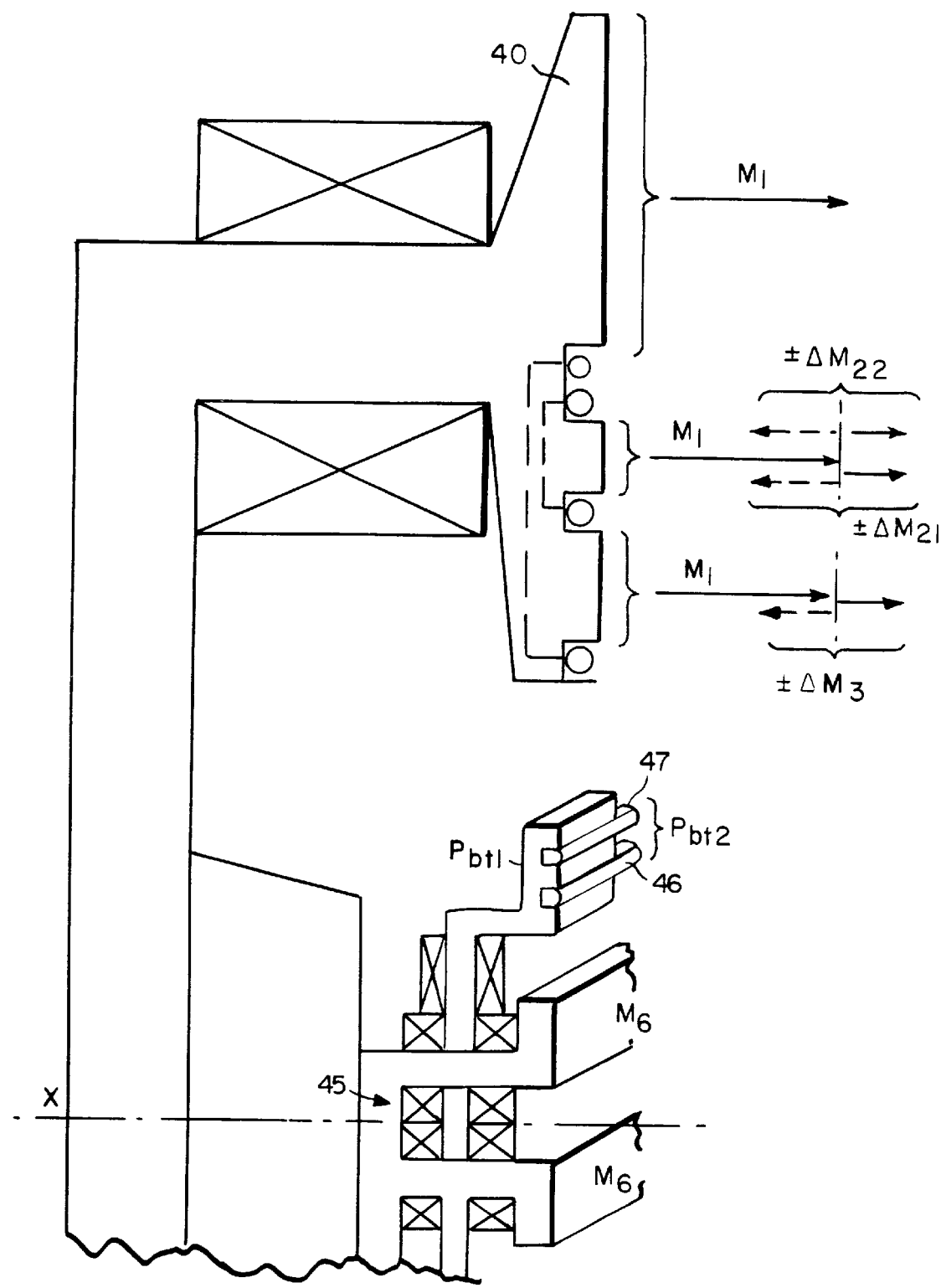
FIG. 4A is a partial side view, partially in cross section of an open planar magnet configuration having pole pieces on both the primary magnet system and the bias magnet system and illustrating a planar shimming coil array in accord with one embodiment of the present invention.
Figure 4B:
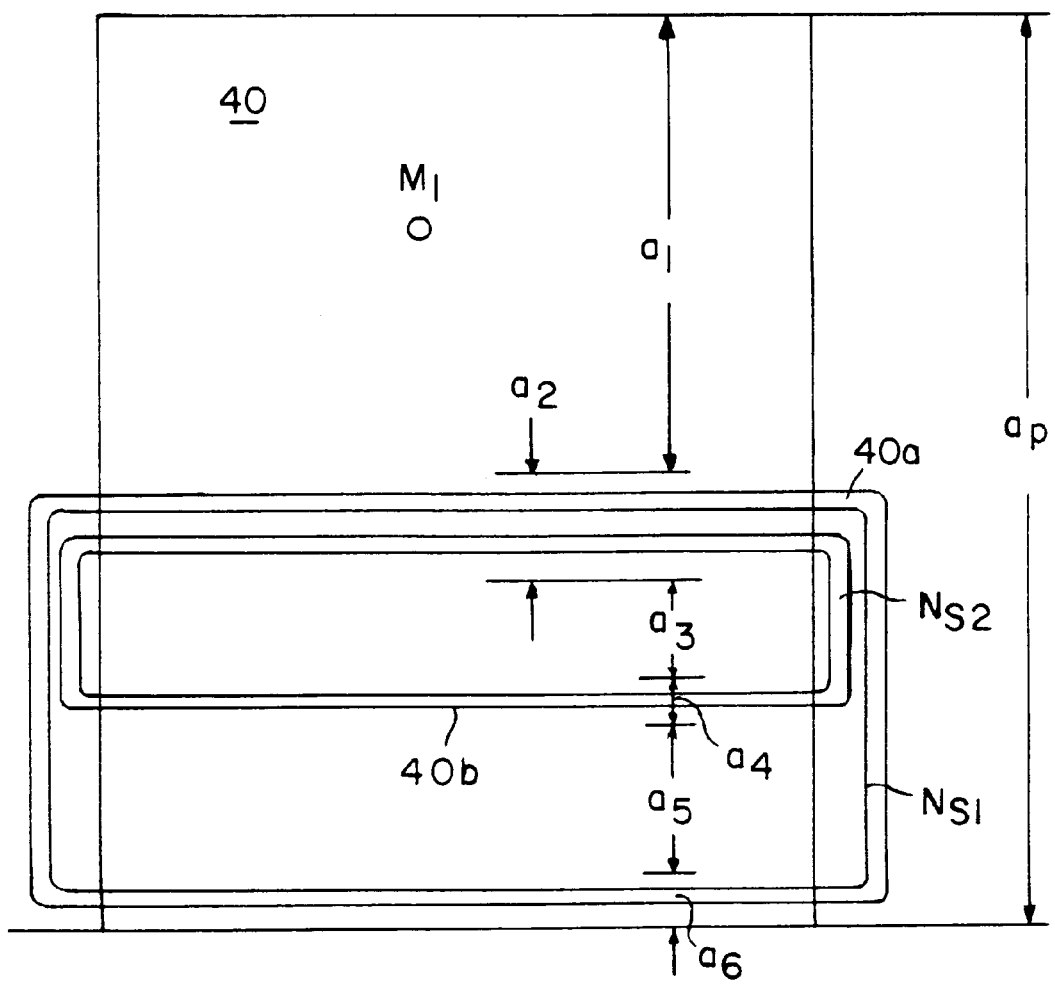
FIG. 4B is a plan view of one primary field pole piece of the magnet configuration illustrated in FIG. 4A.

FIGS. 4A and 4B illustrate an alternative embodiment of a planar shimming coil array configured to provide a remote field maximum in a given target region to increase the range of X having a homogeneity within a predetermined ΔB. Thus, this planar shimming coil array configuration provides enhanced X-axis homogeneity. In this embodiment, a larger loop 40a provides a flux emitted away from the pole piece 40 and a smaller loop 40b provides opposite flux. A corresponding pattern of loops is provided on the other primary magnet pole (not shown). The wires are laid conveniently in slots provided in the pole piece.

For solenoidal coil magnets, which have no ferromagnetic pole piece, a plate of non-magnetic material can be provided with suitable slots and used as a form for making the shimming coil array.

Also illustrated in FIG. 4A is an alternative bias magnet system, which has multiple subpole pieces. Four subpole pieces are symmetrically arranged around a center axis X (only three subpole pieces being illustrated). Alternative bias coil configurations are illustrated for providing the bias field. Shimming or trimming coils 46, 47 are shown on one of the bias subpole pieces.

Figure 5B:
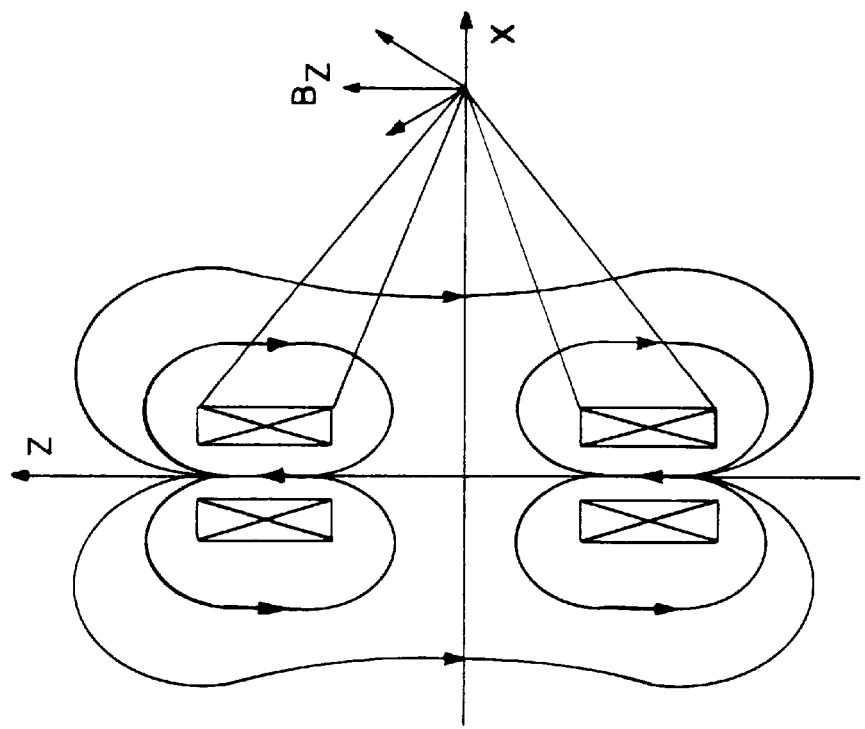
FIG. 5B is a side view illustrating field along the X-axis generated by the pair of unipolar rectangular solenoidal shimming coils of FIG. 5A.
Figure 5A:
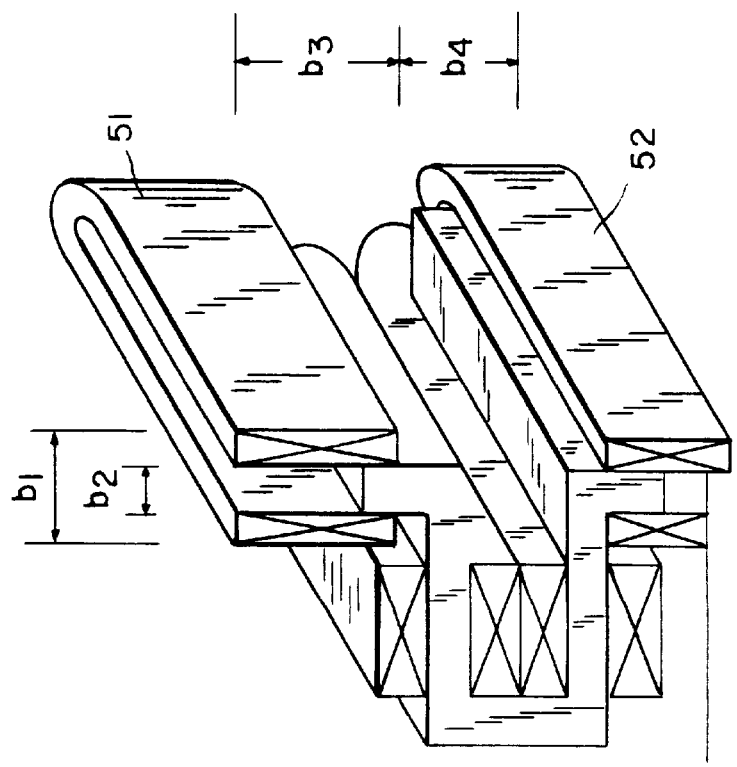
FIG. 5A is an isometric view illustrating a bias magnet system having unipolar rectangular solenoidal shimming coils.

FIG. 5A illustrates another alternative embodiment for configuration of a bias magnet system. In this embodiment, solenoidal coils 51,52 are illustrated as shimming or trimming coils. FIG. 5B illustrates field lines generated by the solenoidal coils of FIG. 5A.

Figure 6A:
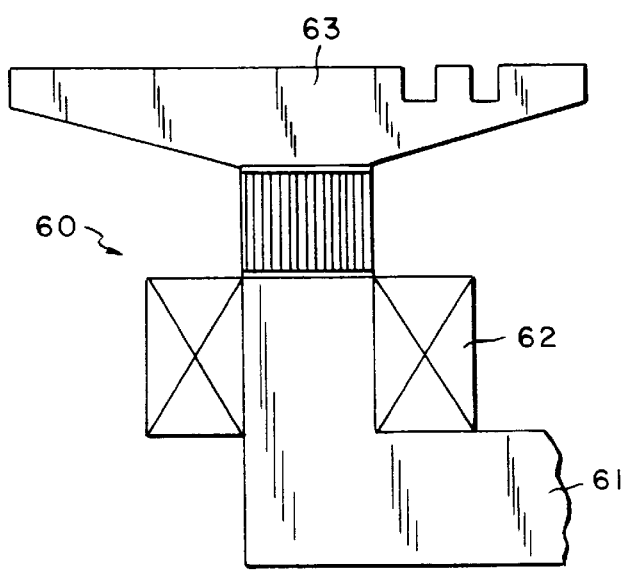
FIG. 6A is a front elevational view of a portion of a primary magnet system illustrating laminated ferromagnetic core structure.
Figure 6B:
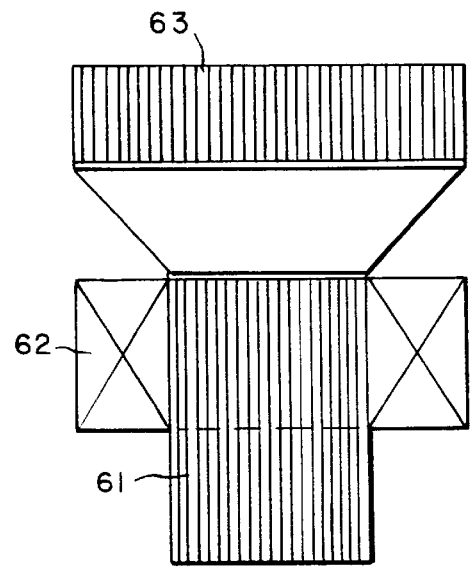
FIG. 6B is a side view of the portion of the primary magnet system illustrated in FIG. 6A.
Figure 6C:
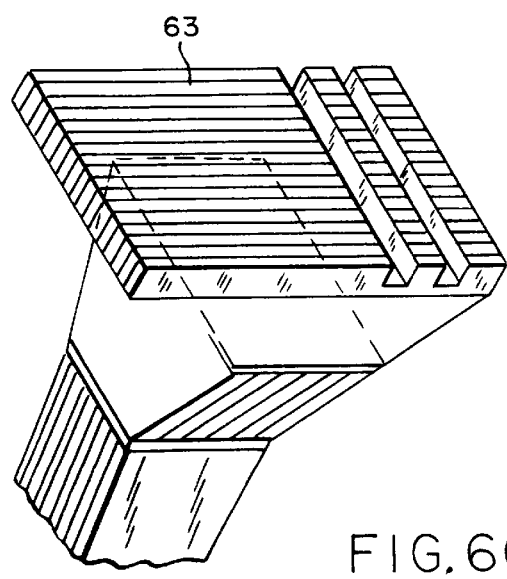
FIG. 6C is an isometric view of a portion of the primary magnet system illustrated in FIG. 6A.

FIGS. 6A, 6B and 6C illustrate the construction of one portion of a primary magnet system 60 with a ferromagnetic core 61 for return flux, a primary coil 62, and a ferromagnetic pole piece 63. Each of the ferromagnetic components is made of a plurality of layered plates to reduce eddy currents. Adjacent components also have the layered plates oriented at right angles to further reduce current eddies across structural components.

Figure 7:
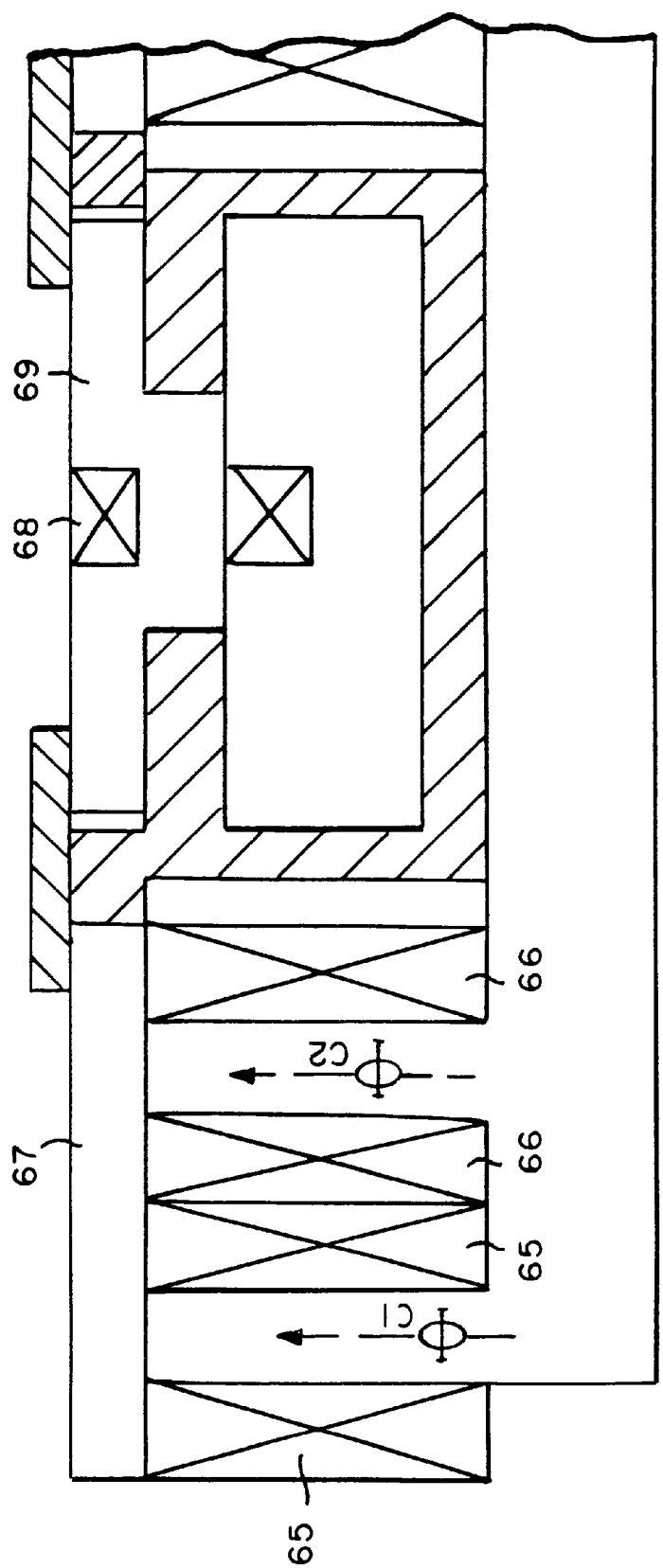
FIG. 7 is a front elevational view, partly in cross section, of a portion of a planar open magnet configuration.
Figure 15:
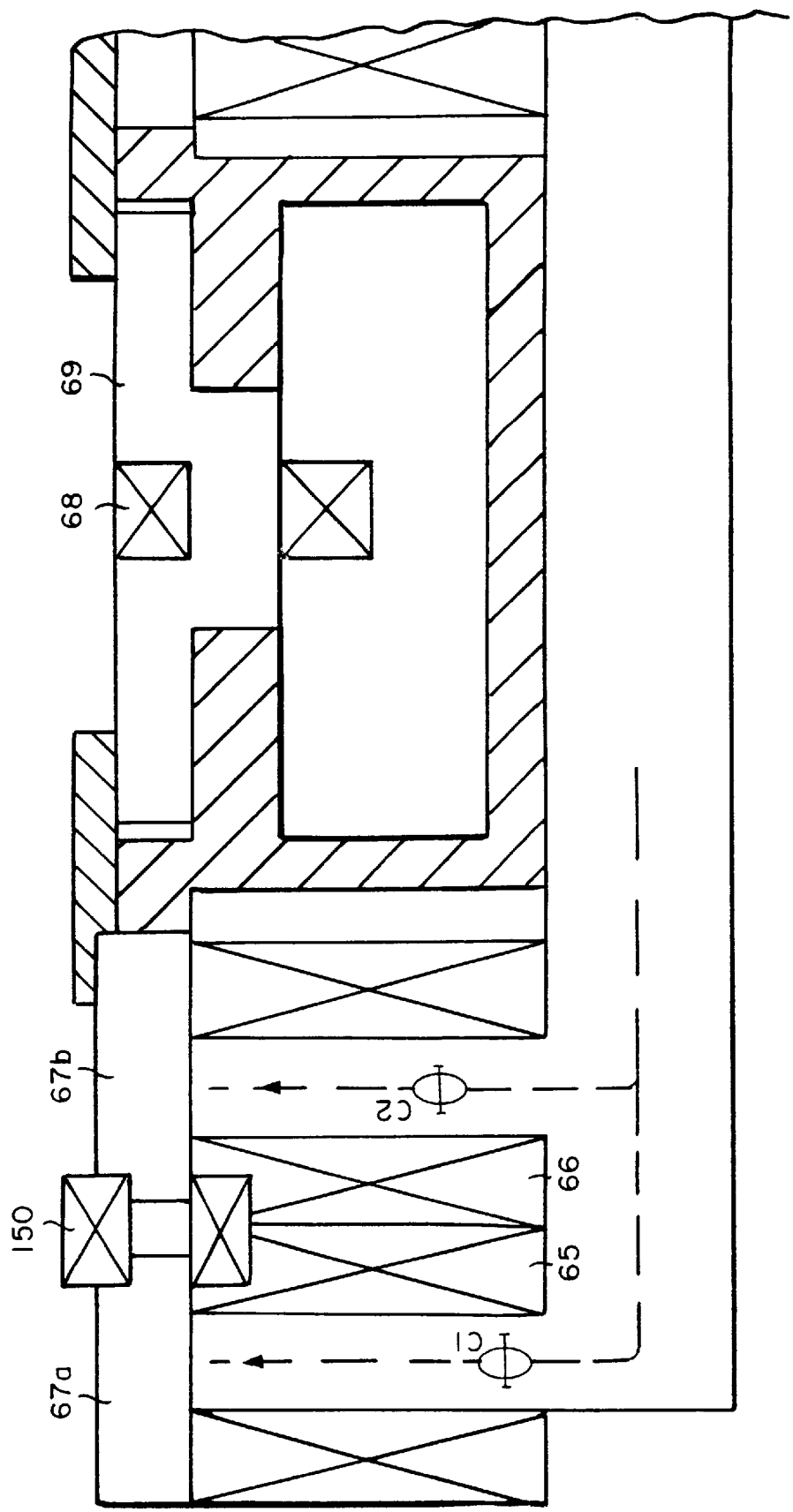
FIG. 15 is a front elevational view, partly in cross section, of an alternative embodiment of a portion of a planar open magnet configuration.

FIG. 7 illustrates an alternative configuration for a primary magnet wherein two coils 65, 66 are positioned in parallel to provide flux to a single pole piece 67. Only one pole is illustrated. The opposing pole of the magnet configuration is preferably the same structure. A single bias coil 68 having a magnetization axis orthogonal to the axes of the primary magnetization coils is illustrated with a bias pole piece 69. This configuration having parallel primary coils can be used to enhance the excitation coil efficiency. Excitation field efficiency drops as a function of the coil thickness or number of turns located around the magnet core. Another alternative embodiment of a magnet configuration is illustrated in FIG. 15. This embodiment is similar to the embodiment illustrated in FIG. 7 but preferably has split pole pieces 67a, 67b at each pole of the magnet configuration (one end shown) and has an additional decoupling coil 150 between the split pole pieces. The additional decoupling coil has a magnetization axis orthogonal to the axes of the primary magnetization coils. The decoupling coil can also be provided using a single pole piece. An advantage of this configuration is, by use of the decoupling coil 150, to minimize or even eliminate undesirable coupling between the magnetic flux between the primary excitation coils 65, 66, as well as the shim coils and the bias coil. The decoupling coil 150 also has shimming capability. However, additional shim coils as described herein preferably are used in combination with the decoupling coil to obtain optimum field homogeneity in the target region. In an embodiment having split pole pieces 67a, 67b as illustrated in FIG. 15, the decoupling coil can be located in the air gap between the split pole pieces.

Figure 8:
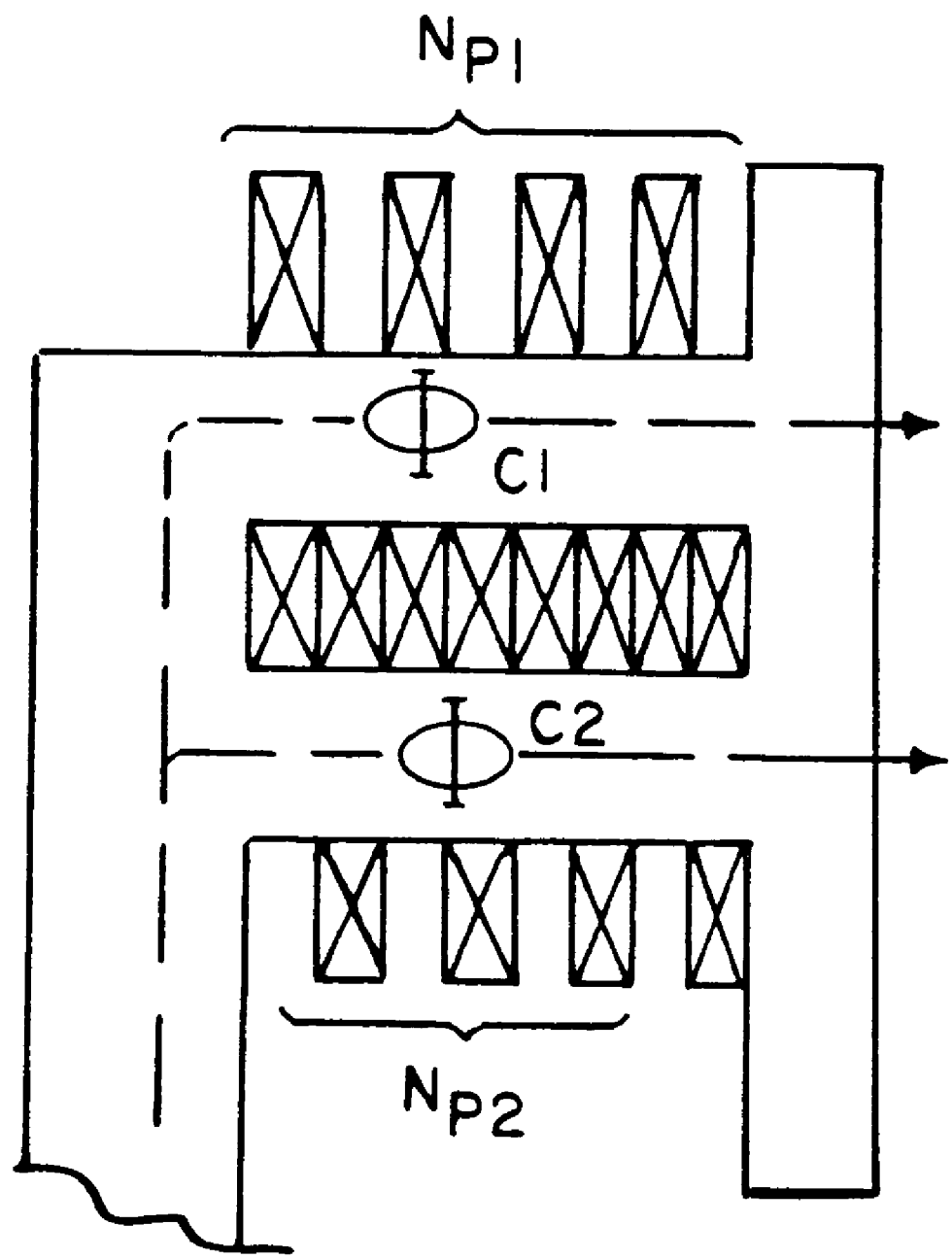
FIG. 8 is an alternative structure for one portion of a primary magnet system of a planar open magnet configuration.

FIG. 8 illustrates another configuration for a primary magnet using multiple coils in parallel to provide flux to a single pole piece to enhance the excitation coil efficiency.

Figure 9B:
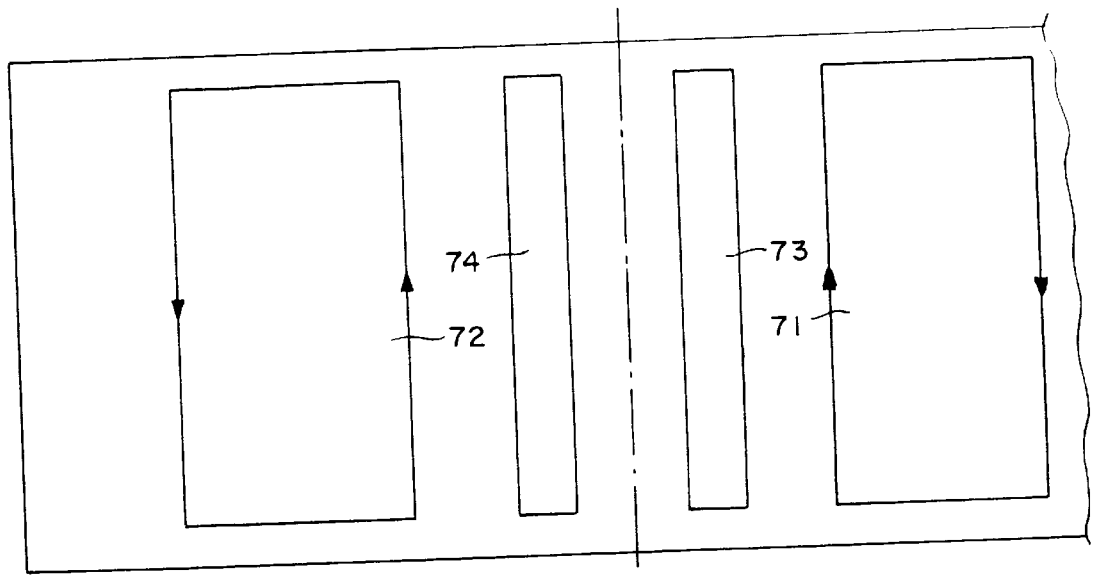
FIG. 9B is a plan view schematic illustration of the ceiling coil system of FIG. 6A.
Figure 9A:
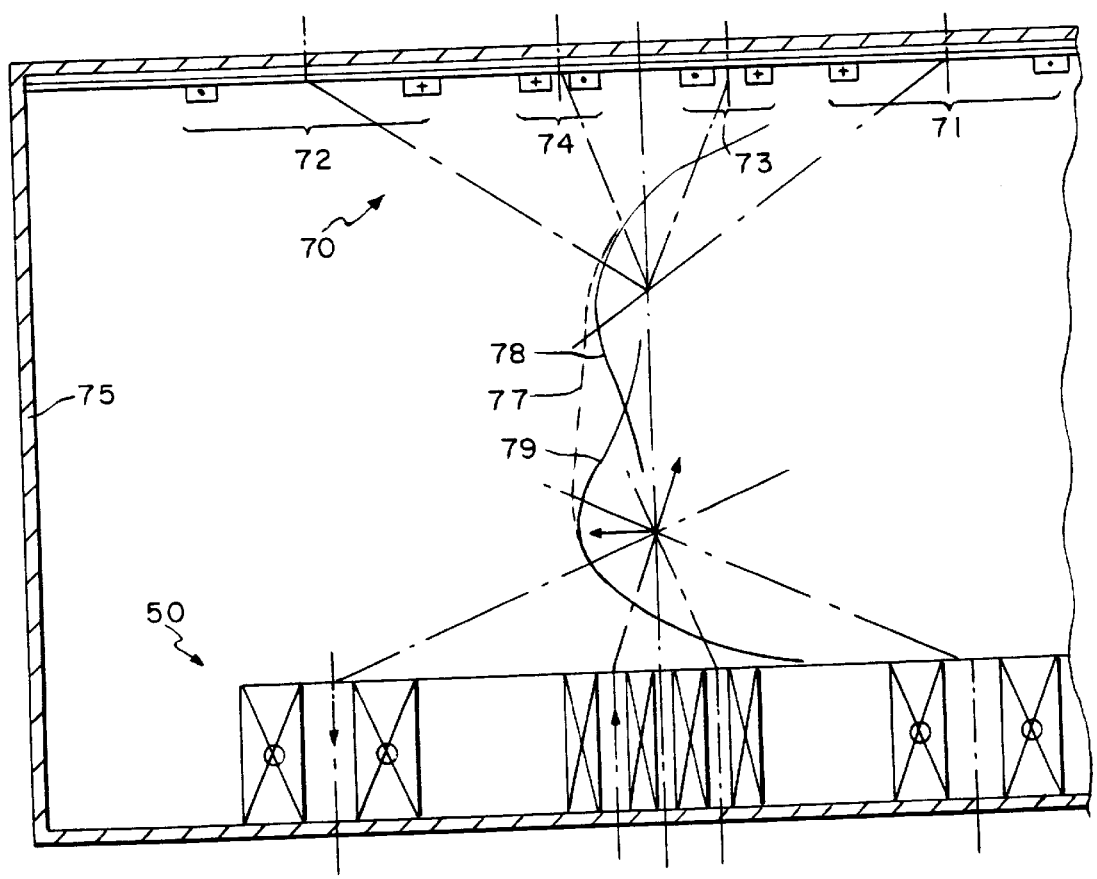
FIG. 9A is a side view schematic illustration of room shield shimming configuration showing a magnet configuration as illustrated in FIG. 3A and a ceiling coil system.

In another embodiment of the present invention, a system for shielding the ceiling in a room, in which the magnet systems of the present invention are used for MRI, is provided as illustrated in FIGS. 9A and 9B. A shielding and shimming coil system 70 is located at or in the ceiling of the room (se FIG. 9A). The ceiling shielding system uses two primary coils 71,72 and two bias coils 73,74 located between the primary coils, as illustrated in FIG. 9B. A magnet system 50 (which is a similar system to that illustrated in FIG. 4A) is located on the floor of the room. Ferromagnetic shielding material can be used in the floor and walls 75. The shielding coil system 70 in the ceiling provides a flux profile as illustrated by curve 78. The magnet system 50 provides a flux profile as illustrated by curve 79. The superposition of the fluxes or total field profile is illustrated by curve 77. As with the magnet systems of the present invention, the field profile of the ceiling shielding and shimming system 70 can be adjusted by varying the ratios of coil turns and current for the primary 71,72 and bias coils 73,74. Thus, the ceiling shielding system 70 can provide a shimming effect for the magnet system 50 and can be used to enhance or vary the remote region of substantial field homogeneity as illustrated by curve 77 (FIG. 9A). Although it is presently preferred to locate the shielding and shimming system in the ceiling of a room, the shielding and shimming system can also be located in a substantially planar structure positioned substantially parallel to the primary poles of the magnet system to provide a similar effect.

In accord with the present invention, a MRI system comprising a magnet configuration preferably also comprises a set of xyz gradient coils to provide spatial encoding in the remote region of background $B_o$ field homogeneity for imaging. In keeping with the planar open design of the magnet geometry and configuration of the present invention, planar xyz gradient coils were created. Advantageously, the remote field xyz gradient coils are preferably planar open surface coils. Preferably, the entire gradient coil is substantially in the same plane. In accord with the present invention, each current plane coil does not have a complimentary or mirror image current plane in order to generate the desired gradient field between the complimentary planes. Thus, in accord with the present invention, each single planar gradient coil produces a remote gradient field along the x, y or z axis in the target region of background field homogeneity.

Figure 10:
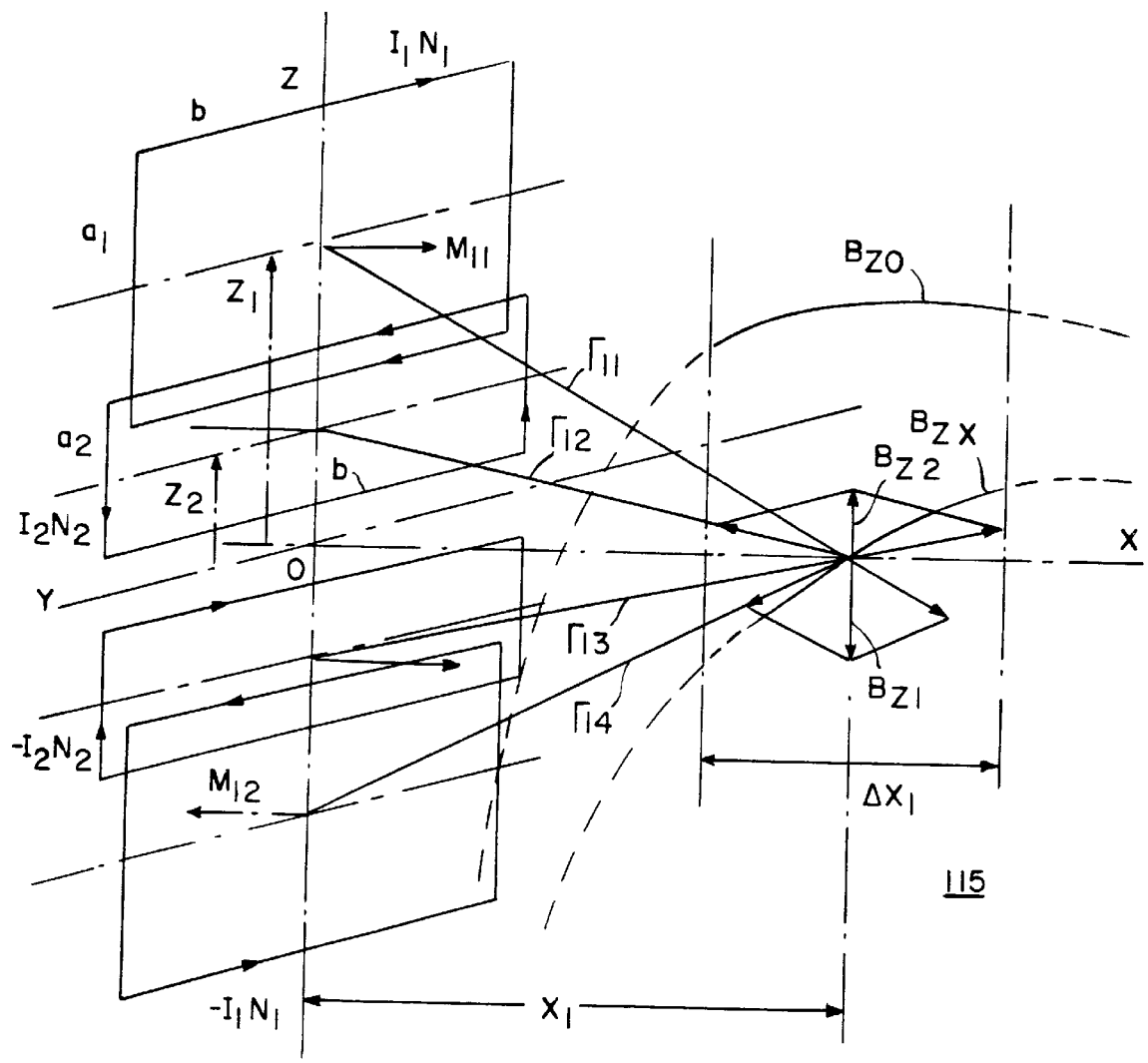
FIG. 10 is a schematic illustrating a planar remote field x-gradient coil in the form of an array of current loops and further illustrating at the center of each loop the vector magnetic dipole associated with the loop. Also illustrated are the field vectors generated by the magnet dipoles, which shows an approximately constant gradient field.

In accord with this invention, as illustrated in FIG. 10, a planar remote field x-gradient coil can be constructed using multiple current loops in a current loop array configuration. As shown, two external loop sections are configured to have mutually opposite current polarity. Two internal current loop sections are configured also to have mutually opposite current polarity and the current polarity in the inner loop sections is also mutually opposite its corresponding external loop section. The array loops are symmetric with respect to the y and z axes.

Also illustrated on the right side of FIG. 10 is a simple field computation approximation using the magnetic moment vectors associated with the current loops. The basic $B_z$ field components at $x_1$ contributed by each of the four magnetic dipoles are shown. The vector sum of the field from the two main current loops with current $I_1$ and turns $N_1$ is denoted $B_{z1}$ and the two bias current loops with current $I_2$ and turns $N_2$ is denoted $B_{z2}$. Also illustrated on right hand side of FIG. 10 are (i) the vector sum of the field from the current loops which produces a gradient field $B_{z,x}$, which is substantially linear over the target field region $\Delta x_1$ and which corresponds to the region in which the background field $B_{z,o}$ (also shown) goes through an extremum.

Figure 11A:
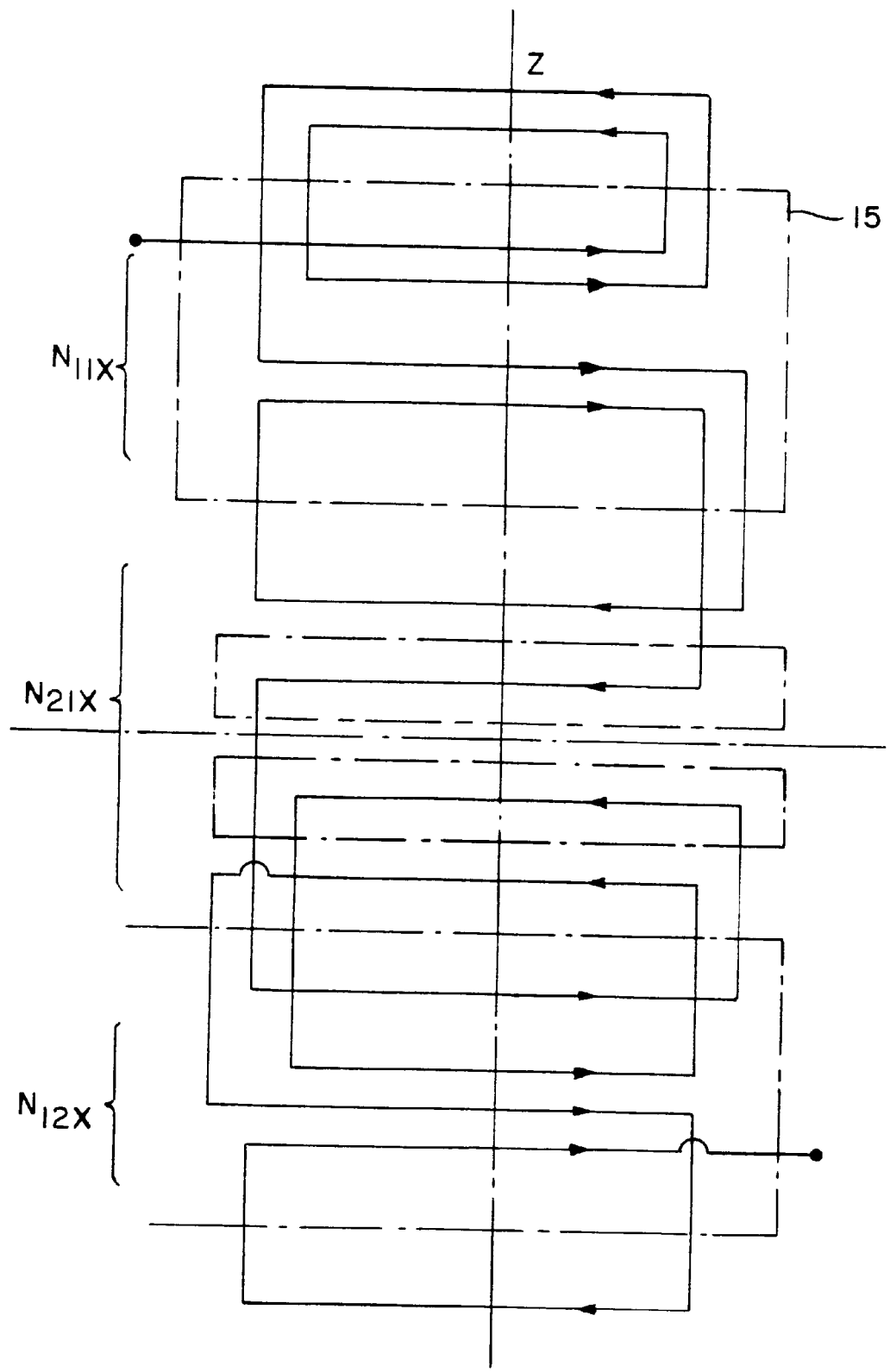
FIG. 11A is a schematic plan view illustration of a planar remote field x-gradient coil in the form of an array of current wires.

An alternative x-gradient coil structure is illustrated in FIG. 11A, with field lines of the two opposing fluxes illustrated in FIG. 11B with the resultant x-gradient field, z component, $B_{z,x}$ which is substantially linear over $\Delta x_1$ illustrated in the right side of FIG. 11B. This coil structure is a current wire array and will provide a remote linear x-gradient field similar to the current loop array depicted in FIG. 10. FIG. 11C illustrates a simple three wire system for demonstration purposes.

The x-gradient coil structure has ampere wire distribution on a planar surface 115 with two external unidirectional current wire sections $N_{11x}$ and $N_{12x}$ with a central unidirectional current section $N_{21x}$ having opposite current polarity to provide a central bias field, thereby providing a remote z-component field having substantially constant gradient as illustrated in FIG. 11B.

It should be noted that the x-gradient coil geometry is similar in concept to the magnet geometry for the $B_o$ background field.

Figure 12A:
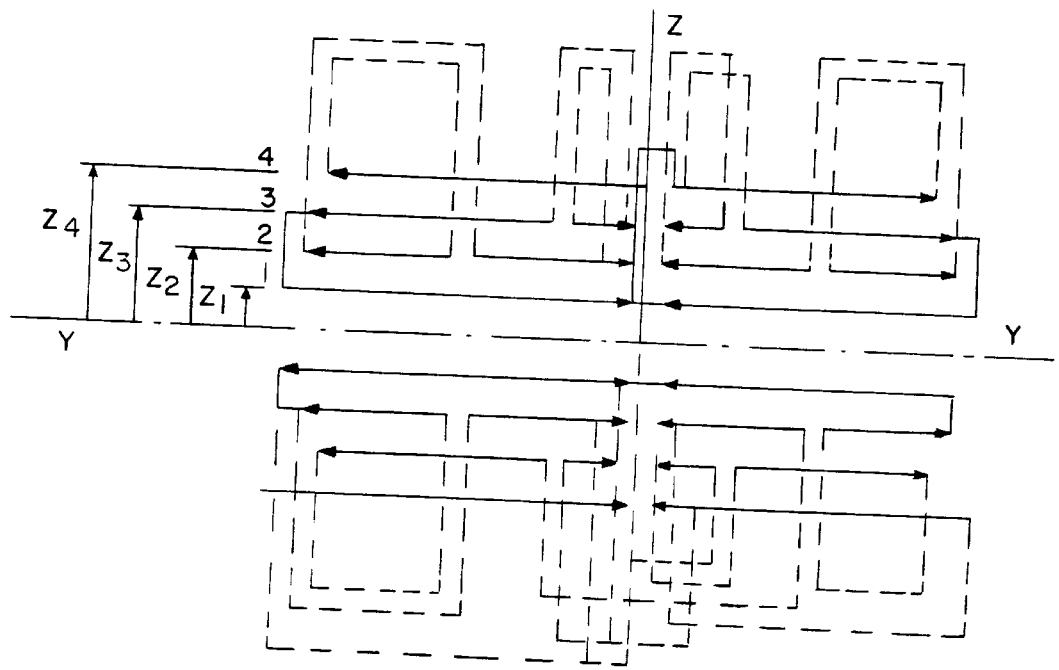
FIG. 12A is a schematic plan view illustration of a planar remote field y-gradient coil in the form of a current wire array.

In accord with this invention, as illustrated in FIG. 12A, a planar remote field y-gradient coil can be constructed using a current wire array. As illustrated, the current wire array preferably has four sections corresponding to four y,z quadrants: first having coordinates 0, −y, z; the second having coordinates 0, y, z; the third having coordinates 0, −y, −z; and the fourth having coordinates 0, y, −z; in other words, the quadrant boundaries are the y and z axes in the x=0 plane. Each quadrant section is divided in subsections along the y axis. The subsections at each z-level ($z_1$, $z_2$, $z_3$ . . . ) are symmetrical about and have opposing current polarity with respect to the z-axis. The subsections are also symmetrical about and have the same current polarity with respect to the y-axis. As can be seen from FIG. 12B, the number of current wires remains constant over y at each level of z, however, the number of wires having positive and negative current polarity varies along y. The current wires providing the remote y-gradient field are connected by return wires (dashed in FIG. 12A) which are located far enough away from the desired wire current array to minimize target field disturbance.

Figure 12B:
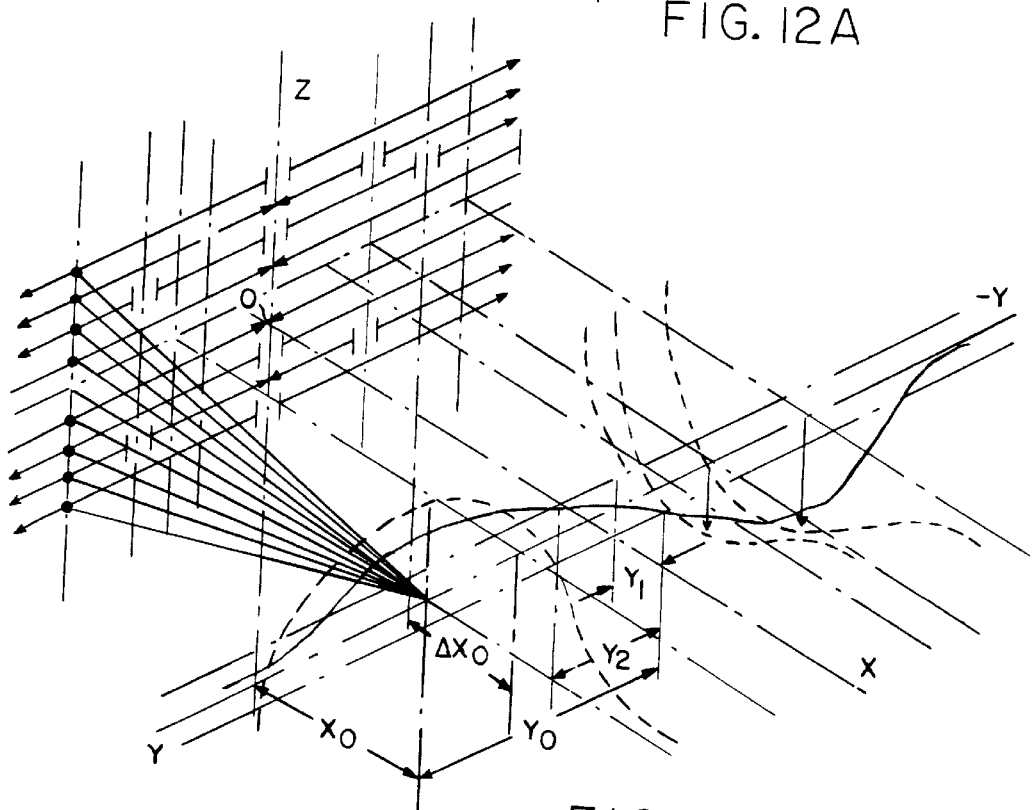
FIG. 12B is an isometric illustration of the planar array of FIG. 12A including an illustration of the remote y-gradient field provided by the array of FIG. 12A.

FIG. 12B illustrates the current wire array, which is located in the x=0 plane, extends in the y direction from $+y_o$ to $-y_o$, and provides a y-gradient field in a remote region. It illustrates only the operative current wires of the array of the wiring schematic of FIG. 12A. The y-gradient field is a field directed in the same direction z as the background field $B_o$ and which varies linearly with y. On the right side of FIG. 12B is an illustration of the y-gradient field at the remote plane x=$x_o$. Note that the field is sinusoidal as a function of y so that the region of linearity is localized around y=0. The region of linearity can be specified as a fraction of $y_o$ which is approximately 0.5 $y_o$. Thus, increasing the spatial extent of the current wire array in y can increase the region of linearity in y.

The gradient field depends upon y because the distribution of current wires with positive and negative currents parallel to the y axis changes with the y position. FIG. 12B illustrates the current pattern changes at y=$y_1$, $y_2$, etc. Thus, between $y_o$ and $y_1$, the current pattern as a function of z is constant and then changes to a different pattern between $y_1$ and $y_2$. The field produced by each of these current patterns is shown as a function of x at each incremental y position where the z pattern of the current wire array changes. In each case, the field goes through an extremum at the same value of x, in this case $x_o$, however, the amplitude of the extremum changes from positive to negative producing the gradient field.

Figure 12C:
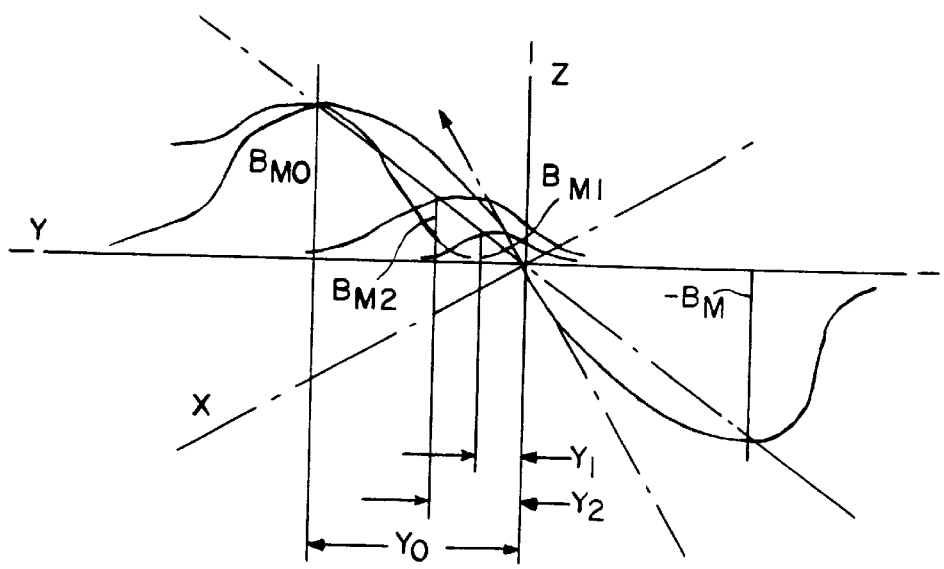
FIG. 12C is an illustration of the y-gradient field profile along the y-axis of FIG. 12B.

FIG. 12C is an illustration of the gradient field profile. Because the field is an extremum at the remote x=$x_o$ plane, it is a region of relative homogeneity. The region of homogeneity of the gradient field extends in the x direction over a distance $\Delta x_o$.

Figure 12D:
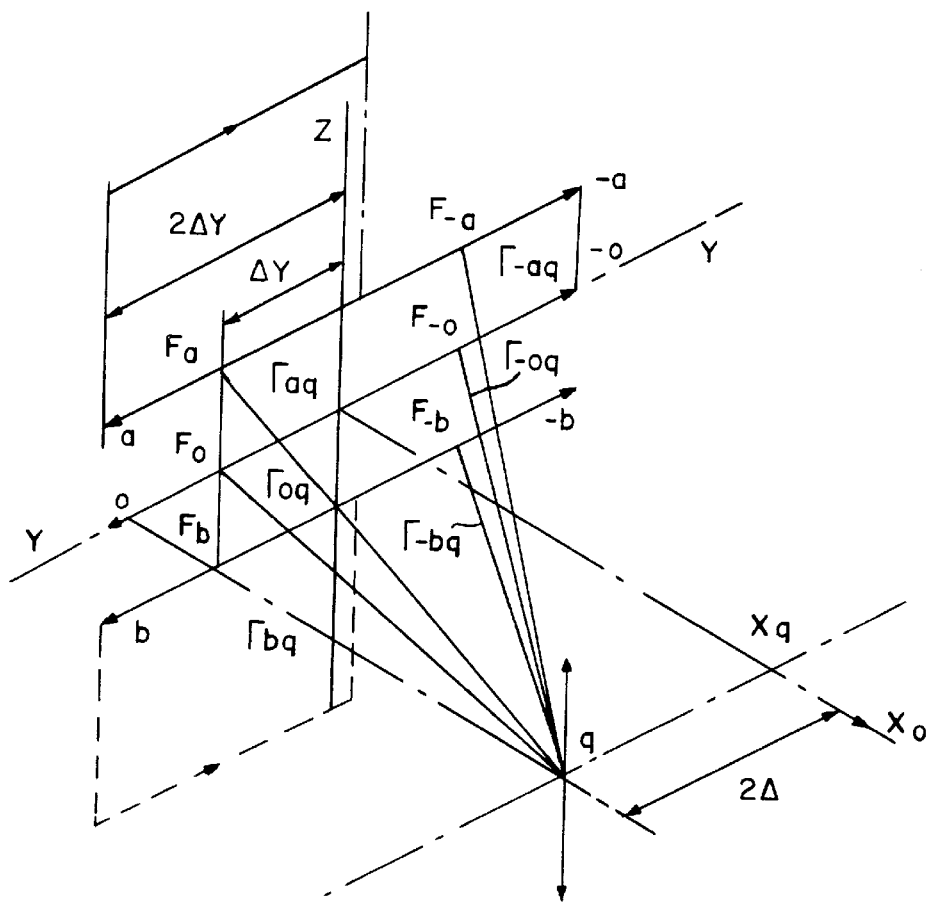
FIG. 12D is an illustration showing a simple six (6) wire array for a y-gradient coil for analysis of coil capability.

FIG. 12D illustrates the simplest six current wire array, which is useful as an analytical model for easy computation of the remote y-gradient field.

Figure 13A:
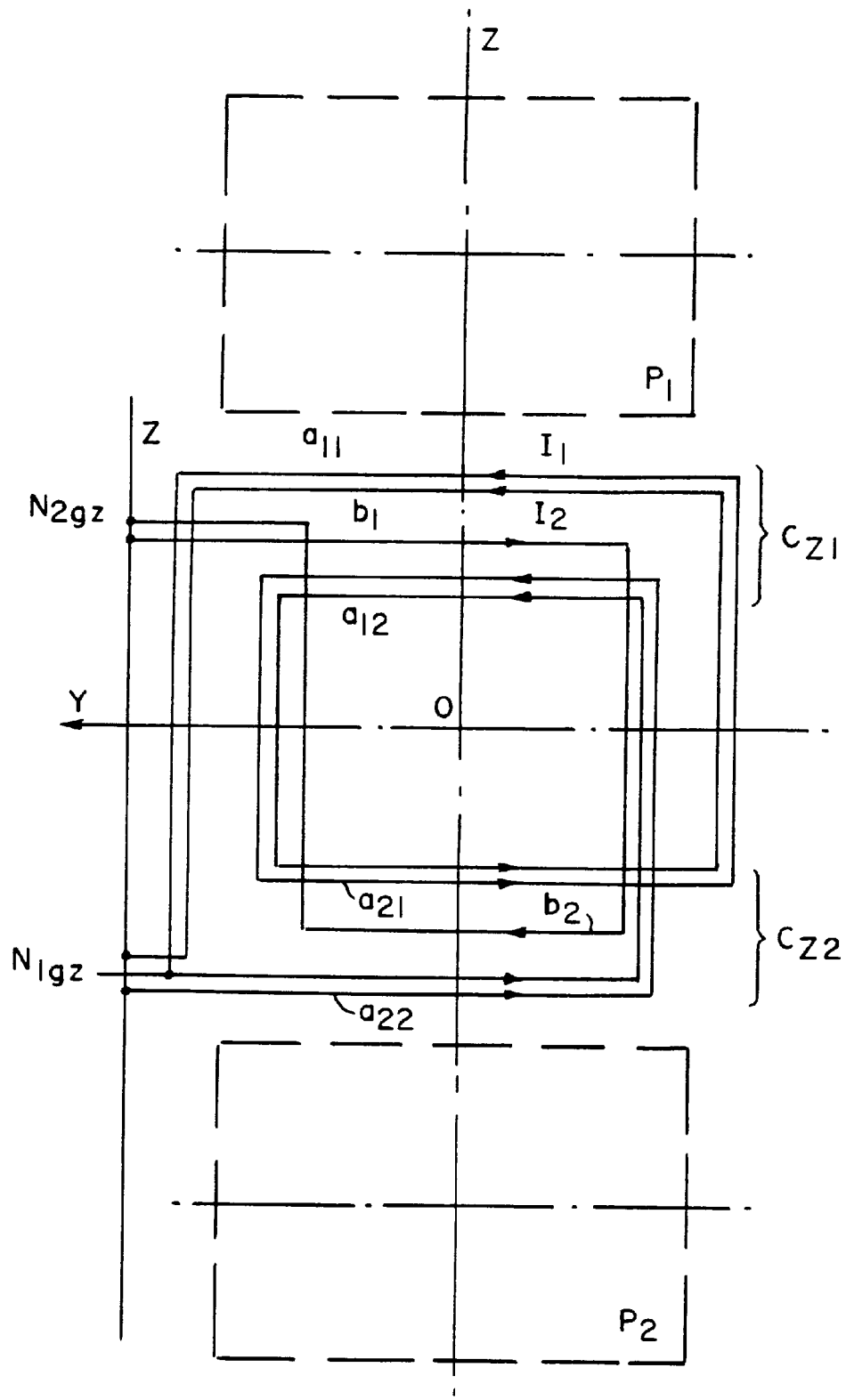
FIG. 13A is a schematic plan view illustration of a planar remote field z-gradient coil in the form of a rectangular loop array.

In accord with this invention, a planar remote field z-gradient coil can be constructed between the pole pieces $P_1$, $P_2$ of the primary magnet as illustrated by the wiring diagram in FIG. 13A. FIG. 13A shows a set of current wires $a_{11}$, $b_1$ and $a_{12}$ at positive values of z and a symmetric set of opposite polarity current wires $a_{22}$, $b_2$ and $a_{21}$, located at corresponding negative values of z. Wires $a_{11}$, $a_{12}$ have current in one direction with the bias wire set $b_1$ having current in the opposite direction. The wire sets $a_{21}$, $a_{22}$ and $b_2$ on the opposite side of the y-axis have currents flowing in the opposite directions to the currents in the corresponding wire sets $a_{11}$, $a_{12}$ and $b_1$. A remote z-gradient field is provided in the target background field. All of the current wires in sets "a" are preferably are connected, as illustrated, to be supplied by a single power source. Similar to the field produced by the y-gradient coil of FIG. 12A, these two sets of current wires produce a field maximum, each of opposite sign at the remote plane x=$x_o$ at different values of z. This produces the gradient field illustrated in FIG. 13B.

Figure 13B:
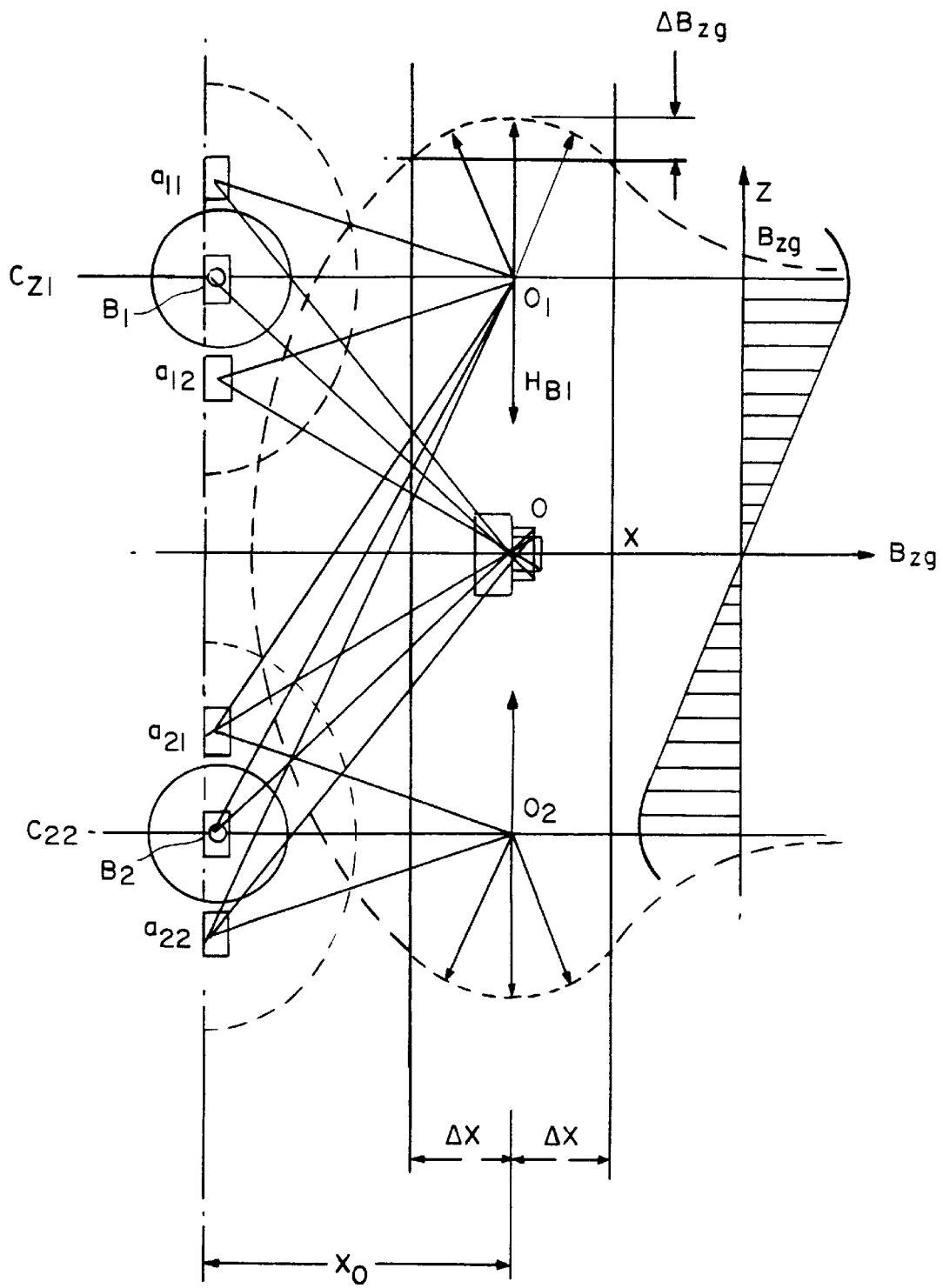
FIG. 13B is a schematic cross sectional view in the xz plane of the wires of the loop array of FIG. 13A and illustrates the remote z-gradient field provided by the z-gradient coil.

FIG. 13B shows a side cross sectional view of the z-gradient coil illustrating field line orientation in the xz plane at y=0 of the wire sets illustrated in FIG. 13A with a plot of the z component of the z-gradient field $B_{zg}$ illustrating a substantially constant gradient over a range of z.

Figure 14A:
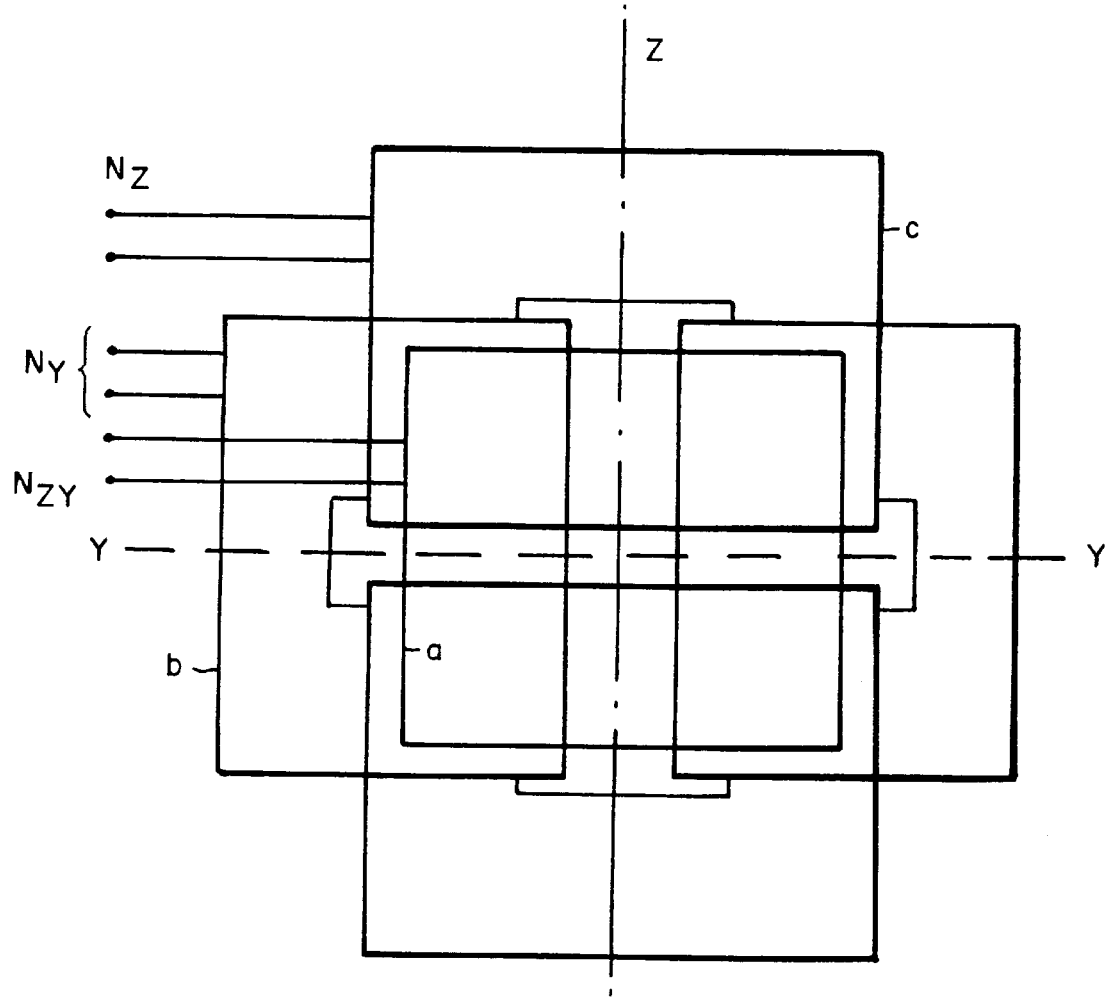
FIG. 14A is a schematic illustration of three rf coils for excitation and detection of the nuclear magnetic resonance signal, which provide a remote x-directional rf field orthogonal to the z directional background field.
Figure 14B:
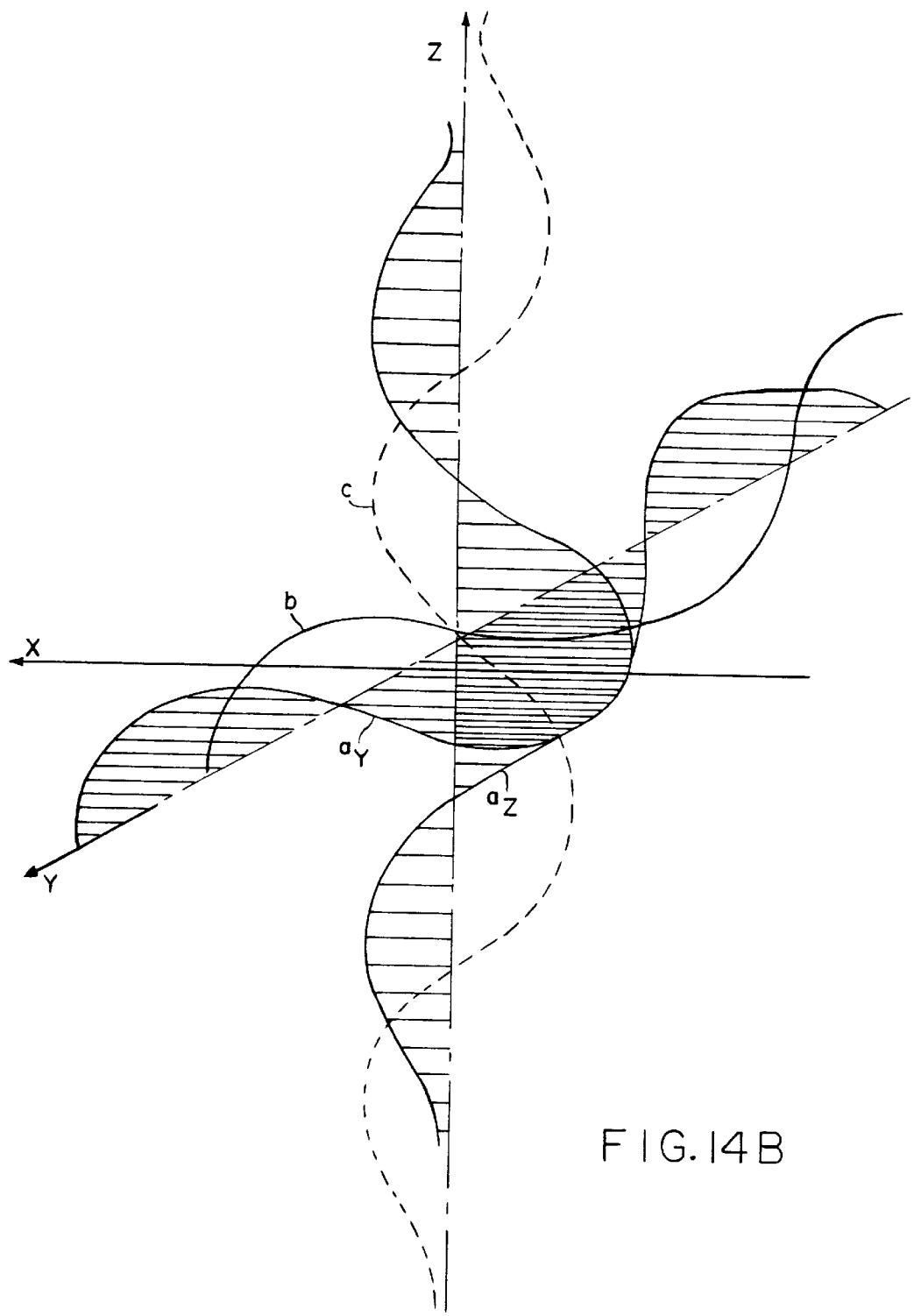
FIG. 14B illustrates the x-directional field provided by the rf coil of FIG. 14A that is orthogonal to the z-axis.

As illustrated in FIG. 14A, a planar rf coil set useful in connection with the present invention is illustrated, which provides a remote region of approximate rf field homogeneity wherein the major components are oriented orthogonal to the z component of the background field, i.e., oriented in the x-direction. The three coils illustrated can be used singly or in combination with each other to produce an rf field perpendicular to the $B_o$ field in different regions of the target volume. By varying the number of coaxial current loops in the rf coils, which can be in different but parallel planes, the region of the x-oriented rf field homogeneity can be positioned in the region of remote field homogeneity of the background field. FIG. 14B illustrates the x-directional field provided by the rf coil of FIG. 6A, which is orthogonal to the z-axis. However, it will be appreciated by those skilled in the art that the rf field must be perpendicular to the $B_o$ field (which for discussion in this specification is in the z direction). Thus, an rf field in the y direction can also be illustrated in a similar manner and provided used for excitation and detection of the nuclear magnetic resonance signal.

The open magnet configuration providing a remote background field for MRI can be made in any size to provide whole body capability or a portable system for more localized imaging. Additional conventional shimming means can also be used in combination with the planar shimming coil arrays of the present invention to define and position the remote region of background field homogeneity.

Planar xyz gradient and rf coils are positioned below the patient table and can extend over the surface of the main pole pieces. The particular geometry and size of the gradient and rf coils must be optimized for each particular application, as is well known in the art.

The invention has been described in detail with reference to preferred embodiments thereof. However, it will be appreciated that, upon consideration of the present specification and drawings, those skilled in the art may make modifications and improvements within the spirit and scope of this invention as defined by the claims. For example, unless specifically excluded, iron core electromagnets, permanent magnets or solenoidal coils can be used to provide a field. For the active planar shimming arrays of the invention, ferromagnetic pole pieces having suitable slots or slotted non-magnetic plates can be used as a form for the wire loops.

I claim:

1. A magnet resonance imaging system comprising an open magnet structure that provides a remote region of background field homogeneity for imaging, spatial encoding gradient coils and an rf coil, wherein the open magnet comprises a planar active shimming coil array.

2. The magnet resonance imaging system of claim 1, wherein the active planar shimming coil array comprises a pair of current loops arranged and constructed in a plane separating the open magnet structure from the remote region, a first loop having current in a first direction to provide a magnetic flux away from the plane and a second loop having current in the opposite direction to provide a magnetic flux toward the plane.

3. The magnet resonance imaging system of claim 1, wherein the magnet structure has two poles providing the primary background field and wherein the active planar shimming coil array comprises two pairs of current loops, each pair of current loops being arranged and constructed in a plane at one pole of the magnet structure separating the open magnet structure from the remote region and comprising a first loop having current in a first direction to provide a magnetic flux away from the plane and a second loop having current in the opposite direction to provide a magnetic flux toward the plane, and wherein the arrangement of both pairs of current loops are identical.

4. The magnet resonance imaging system of claim 1, wherein the magnet structure has two poles providing the primary background field and wherein the active planar shimming coil array provides X-axis enhancement of remote field homogeneity, said shimming coil array comprising two pairs of current loops, each pair of current loops being arranged and constructed in a plane at one pole of the magnet structure separating the open magnet structure from the remote region and comprising a first substantially rectangular loop having current in a first direction to provide a magnetic flux away from the plane and a substantially rectangular second loop having current in the opposite direction to provide a magnetic flux toward the plane, the loops being arranged to have a longest side perpendicular to a longitudinal axis of the magnet structure, and wherein the arrangement of both pairs of current loops are identical.

5. The magnet resonance imaging system of claim 1, wherein the magnet structure has two poles providing the primary background field and wherein the active planar shimming coil array provides Y-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged on one side of a longitudinal axis of the magnetic structure with a first loop having current in a first direction to provide a magnetic flux away from the plane and a substantially rectangular second loop having current in the opposite direction to provide a magnetic flux toward the plane, and a second pair of loops arranged on the opposite side of the longitudinal axis, the second pair of loops having an identical arrangement with the first pair of loops, the remaining two pairs being arranged in a plane at the other pole of the magnet structure separating the open magnet structure from the remote region and having an identical arrangement with the first two pairs of loops.

6. The magnet resonance imaging system of claim 1, wherein the magnet structure has two poles providing the primary background field and wherein the active planar shimming coil array provides Z-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged inside the second pair of substantially rectangular loops, each pair of lops having a first loop having current in a first direction to provide a magnetic flux away from the plane and a substantially rectangular second loop having current in the opposite direction to provide a magnetic flux toward the plane, the second pair of loops being arranged to have opposite polarity to the first pair of loops, the remaining two pairs being arranged in a plane at the other pole of the magnet structure separating the open magnet structure from the remote region and having an identical arrangement with the first two pairs of loops, each of the loops being arranged to have a longest side perpendicular to a longitudinal axis of the magnet structure.

7. A magnet resonance imaging system comprising an open magnet structure that provides a remote region of background field homogeneity for imaging, spatial encoding gradient coils and an rf coil;

wherein the magnet structure has two poles providing the primary background field;

wherein the open magnet further comprises an planar active shimming coil array, the planar active shimming coil array comprising a X-axis planar shimming coil array, a Y-axis planar shimming coil array and a Z-axis planar shimming coil array;

wherein the X-axis planar shimming coil array provides X-axis enhancement of remote field homogeneity, said shimming coil array comprising two pairs of current loops, each pair of current loops being arranged and constructed in a plane at one pole of the magnet structure separating the open magnet structure from the remote region and comprising a first substantially rectangular loop having current in a first direction to provide a magnetic flux away from the plane and a substantially rectangular second loop having current in the opposite direction to provide a magnetic flux toward the plane, the loops being arranged to have a longest side perpendicular to a longitudinal axis of the magnet structure, and wherein the arrangement of both pairs of current loops are identical;

wherein the Y-axis planar shimming coil array provides Y-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged on one side of a longitudinal axis of the magnetic structure with a first loop having current in a first direction to provide a magnetic flux away from the plane and a substantially rectangular second loop having current in the opposite direction to provide a magnetic flux toward the plane, and a second pair of loops arranged on the opposite side of the longitudinal axis, the second pair of loops having an identical arrangement with the first pair of loops, the remaining two pairs being arranged in a plane at the other pole of the magnet structure separating the open magnet structure from the remote region and having an identical arrangement with the first two pairs of loops; and wherein the Z-axis planar shimming coil array provides Z-axis enhancement of remote field homogeneity, said shimming coil array comprising four pairs of current loops, two pairs of current loops being arranged and constructed in a plane at one pole of the magnet structure separating the open magnet structure from the remote region and comprising a first pair of substantially rectangular loops arranged inside the second pair of substantially rectangular loops, each pair of lops having a first loop having current in a first direction to provide a magnetic flux away from the plane and a substantially rectangular second loop having current in the opposite direction to provide a magnetic flux toward the plane, the second pair of loops being arranged to have opposite polarity to the first pair of loops, the remaining two pairs being arranged in a plane at the other pole of the magnet structure separating the open magnet structure from the remote region and having an identical arrangement with the first two pairs of loops, each of the loops being arranged to have a longest side perpendicular to a longitudinal axis of the magnet structure.

8. The magnet resonance imaging system of claim 7, wherein each pole providing the primary background field of the open magnet structure comprises a pair of parallel coils and a decoupling coil is provided between the pair of coils and positioned orthogonal to the pair of coils to reduce unwanted coupling of magnetic flux.

* * * * *